(12) United States Patent
Lee et al.

(10) Patent No.: US 8,008,698 B2
(45) Date of Patent: Aug. 30, 2011

(54) SEMICONDUCTOR MEMORY DEVICES HAVING VERTICAL CHANNEL TRANSISTORS AND RELATED METHODS

(75) Inventors: Deok-hyung Lee, Seoul (KR); Sun-ghil Lee, Gyeonggi-do (KR); Si-young Choi, Gyeonggi-do (KR); Byeong-chan Lee, Gyeonggi-do (KR); Seung-hun Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 278 days.

(21) Appl. No.: 12/198,266

(22) Filed: Aug. 26, 2008

(65) Prior Publication Data
US 2009/0121268 A1  May 14, 2009

(30) Foreign Application Priority Data

Nov. 9, 2007  (KR) .......................... 10-2007-0114189

(51) Int. Cl.
*H01L 27/108* (2006.01)

(52) U.S. Cl. . 257/296; 257/301; 257/329; 257/E21.646; 438/238; 438/239

(58) Field of Classification Search .................. 257/296, 257/301, 302, 329, E21.646, E27.084
See application file for complete search history.

(56) References Cited

U.S. PATENT DOCUMENTS

| 5,736,761 | A | 4/1998 | Risch et al. |
| 5,817,552 | A | 10/1998 | Roesner et al. |
| 6,355,520 | B1 | 3/2002 | Park et al. |
| 2002/0030214 | A1 * | 3/2002 | Horiguchi ..................... 257/301 |

FOREIGN PATENT DOCUMENTS

| JP | 2002-094027 | 12/1996 |
| KR | 10-1996-0043227 | 12/1996 |

* cited by examiner

*Primary Examiner* — Thinh T Nguyen
(74) *Attorney, Agent, or Firm* — Myers Bigel Sibley & Sajovec, P.A.

(57) ABSTRACT

A semiconductor memory device may include a semiconductor substrate with an active region extending in a first direction parallel with respect to a surface of the semiconductor substrate. A pillar may extend from the active region in a direction perpendicular with respect to the surface of the semiconductor substrate with the pillar including a channel region on a sidewall thereof. A gate insulating layer may surround a sidewall of the pillar, and a word line may extend in a second direction parallel with respect to the surface of the semiconductor substrate. Moreover, the first and second directions may be different, and the word line may surround the sidewall of the pillar so that the gate insulating layer is between the word line and the pillar. A contact plug may be electrically connected to the active region and spaced apart from the word line, and a bit line may be electrically connected to the active region through the contact plug with the plurality of bit lines extending in the first direction. Related methods are also discussed.

18 Claims, 29 Drawing Sheets

SEMICONDUCTOR MEMORY DEVICES HAVING VERTICAL CHANNEL TRANSISTORS AND RELATED METHODS

RELATED PATENT APPLICATION

This application claims the benefit of Korean Patent Application No. 10-2007-0114189, filed on Nov. 9, 2007, in the Korean Intellectual Property Office, the disclosure of which is incorporated herein in its entirety by reference.

FIELD OF THE INVENTION

The present invention relates to electronics, and more particularly, to semiconductor memory devices and related methods.

BACKGROUND

As semiconductor memory devices become highly integrated, design rules may be reduced to integrate many elements per unit area. If design rules are reduced, lengths and areas of elements may decrease. Therefore, a current driving ability of an element may be lowered, and passive switching characteristics of the element may deteriorate due to short-channel effects. A vertical channel transistor may be capable of reducing leakage current caused by drain induced barrier lowering (DIBL), punch through and the like while providing relatively high current driving ability.

To reduce process margin limits due to narrow distances between word lines and to increase integration, a highly integrated semiconductor memory device having vertical channel transistors may use a structure in which a buried diffusion bit line is formed on a body, and a vertical gate electrode is then formed on the buried diffusion bit line. However, the buried diffusion bit line may have relatively high resistance. Accordingly, a data transfer speed and access time of the semiconductor memory device may increase, and application of buried diffusion bit lines to memory devices such as high-speed DRAMs may be difficult.

SUMMARY OF THE INVENTION

Embodiments of the present invention may provide highly integrated semiconductor memory devices having vertical channel transistors with a structure capable of providing process margins and bit lines with low resistance.

Embodiments of the present invention also provide methods for manufacturing highly integrated semiconductor memory devices having vertical channel transistors with a structure capable of providing process margins and bit lines with low resistance.

According to some embodiments of the present invention, a semiconductor memory device may include a semiconductor substrate and a plurality of active regions extending in a first direction on the semiconductor substrate. A plurality of pillars may extend in a direction perpendicular with respect to an extension direction of the semiconductor substrate on the active regions to provide vertical channel regions. A plurality of gate insulating layers may surround sidewalls of the pillars and a plurality of word lines may extend in a second direction perpendicular to the first direction while surrounding sidewalls of the pillars on the gate insulating layers. A plurality of first impurity regions may be formed in the active regions, and a plurality of first contact plugs may be connected to the first impurity regions while being spaced apart from the word lines on the active regions. A plurality of bit lines may be connected to the first impurity regions through the first contact plugs and may extend in the first direction on the first contact plugs in a region between two adjacent active regions among the plurality of active regions.

The respective active regions may have parallel line shapes extending in the first direction on the semiconductor substrate. Alternatively, the plurality of active regions may include a plurality of island-shaped active regions each having a major axis extending in the first direction and a minor axis extending in the second direction perpendicular to the first direction on the semiconductor substrate. The bit line may include a line pattern having a bottom surface, two side surfaces and a top surface, and the bottom surface and one side surface of the bit line may simultaneously come in contact with the first contact plug.

The semiconductor memory device may further include a plurality of second impurity regions respectively formed in end portions of the plurality of pillars opposite to the semiconductor substrate with respect to the word lines. Further, the semiconductor memory device may further include a plurality of second contact plugs respectively extending in the same direction as an extension direction of the pillars from the second impurity regions to be opposite to the semiconductor substrate. A plurality of capacitors may be respectively connected to the plurality of second contact plugs.

According to other embodiments of the present invention, a method for manufacturing a semiconductor memory device may include defining a plurality of active regions extending in a first direction on a semiconductor substrate. A plurality of pillars may be formed extending in a direction perpendicular to an extension direction of the semiconductor substrate. A plurality of gate insulating layers surrounding sidewalls of the pillars, and a plurality of word lines may be formed extending in a second direction perpendicular to the first direction while surrounding the sidewalls of the pillars on the gate insulating layers. A plurality of first impurity regions may be formed at positions spaced apart from the word lines in the active regions. A first contact plug may be formed on each of the plurality of first impurity regions. A plurality of bit lines may be formed extending in the first direction at an opposite side to the semiconductor substrate with respect to the word lines while being connected to the first contact plugs.

Forming the plurality of pillars, the plurality of gate insulating layers, and the plurality of word lines may include forming a first interlayer dielectric layer having a plurality of first holes exposing a plurality of regions spaced apart from one another in the active regions on the semiconductor substrate. A plurality of pillars may be formed in the plurality of first holes, and a portion of the first interlayer dielectric layer may be removed thereby forming a plurality of line-shaped trenches simultaneously exposing the plurality of pillars arranged in the second direction perpendicular to the first direction and the active regions around the pillars. A first insulating layer (used to form a gate insulating layer) may be formed on surfaces of the pillars exposed to the trenches and surfaces of the active regions. A conductive material may be formed in the plurality of trenches, thereby forming the plurality of word lines.

Alternatively, the forming of the plurality of pillars, the plurality of gate insulating layers, and the plurality of word lines may include forming a sacrificial insulating layer having a plurality of first holes exposing a plurality of regions spaced apart from one another in the active regions on the semiconductor substrate. A plurality of pillars may be formed in the plurality of first holes, and a portion of a sacrificial insulating layer may be removed, thereby forming a plurality of line-shaped trenches simultaneously exposing the plurality of pillars arranged in the second direction perpendicular to the first direction and the active regions around the pillars. A first insulating layer may be formed for a gate insulating layer on surfaces of the pillars exposed to the trenches and surfaces of the active regions. A conductive material may be formed in the plurality of trenches, thereby forming the plurality of word lines. The sacrificial insulating layer may be completely removed, thereby exposing sidewalls of the plurality of word lines. First insulating spacers may be formed at both sidewalls of each of the plurality of word lines, and a first interlayer dielectric layer may be formed covering the plurality of word lines.

Each of the plurality of bit lines may be formed on a respective first contact plug in a region between two adjacent active regions among the plurality of active regions.

Forming the first contact plug may include forming a first plug having a planarized top surface on the first impurity region, and forming a recess having a bottom surface lower than the top surface of the first plug in a portion of the top surface of the first plug. Forming the recess may include forming a mask pattern exposing a portion of the top surface of the first plug, and etching the first plug using the mask pattern as an etching mask.

Forming the plurality of bit lines may include forming a conductive layer on the semiconductor substrate having the first contact plugs, and patterning the conductive layer, thereby forming a plurality of bit lines.

Alternatively, forming the plurality of bit lines may include forming an insulating mold layer on the semiconductor substrate having the first contact plugs. The insulating mold layer may be patterned, thereby forming an insulating mold layer pattern having a plurality of space lines extending in the first direction while exposing the first contact plugs. Second insulating spacers may be formed on both sidewalls of the insulating mold layer pattern exposed in each of the space lines, and a conductive layer may be formed in the plurality of space lines, thereby forming a plurality of bit lines.

After forming the plurality of bit lines, a second contact plug may be formed extending in a direction perpendicular to the extension direction of the semiconductor substrate from the top surface of each of the plurality of pillars, and a capacitor may be formed on the second contact plug.

According to embodiments of the present invention, in a method for manufacturing a semiconductor memory device, a highly integrated semiconductor device having vertical channel transistors may be provided to implement a highly integrated semiconductor memory device scaled to a high degree without using a structure with buried diffusion bit lines. According to embodiments of the present invention, an open bit line structure may be provided with a bit line on a word line, and/or with a stacked bit line structure. Accordingly, the bit line may be formed of a metal having a relatively low resistance, thereby increasing data transmission speed and/or reducing access time of the device.

BRIEF DESCRIPTION OF THE DRAWINGS

The above and other features and advantages of embodiments of the present invention will become more apparent by describing in detail examples of embodiments thereof with reference to the attached drawings in which.

DETAILED DESCRIPTION

Figure 1:
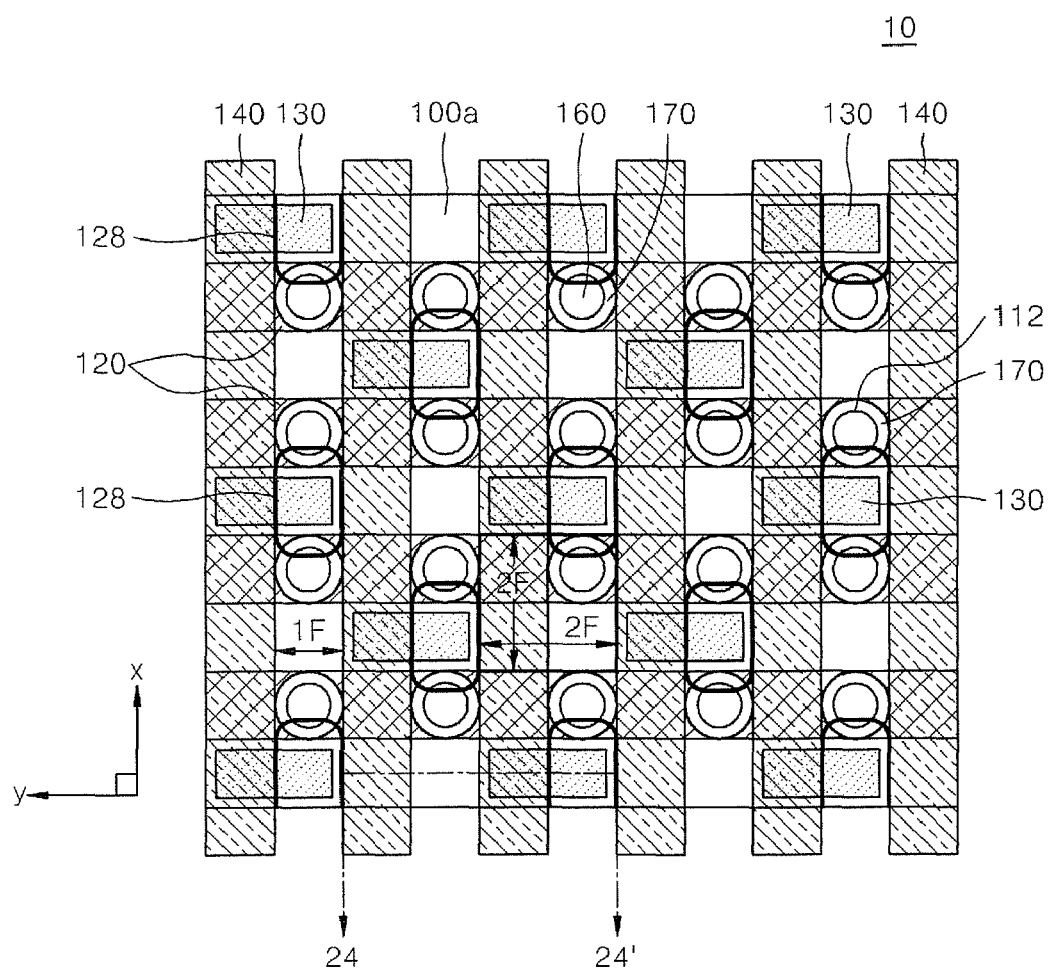
FIG. 1 is a plan view illustrating a layout of a semiconductor memory device according to embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

FIG. 1 is a plan view of a semiconductor memory device 10 according to some embodiments of the present invention. The layout illustrated in FIG. 1 may be applied to a memory cell having a unit cell size of $4F^2$ (F: minimum feature size), for example.

Referring to FIG. 1, the semiconductor memory device 10 may have a plurality of active regions 100a extending in a first direction (the x direction in FIG. 1) on a semiconductor substrate. A plurality of pillars 112 may provide vertical channel regions that extend vertically to an extension surface of a major surface of the semiconductor substrate on each of the active regions 100a. The pillars 112 may be surrounded by word lines 120. The word lines 120 may extend in a second direction (the y direction in FIG. 1) perpendicular with respect to the first direction while simultaneously surrounding the plurality of pillars 112 arranged in a line along an extension direction of the active regions 100a. A sidewall of each pillar 112 may be surrounded by a gate insulating layer (a first insulating layer 114 will be described later with reference to FIG. 4B) between each pillar 112 and the respective word line 120.

A plurality of first impurity regions 128 may be formed in the active regions 100a. Each impurity region 128 may serve as a source and/or drain (also referred to as a source/drain) of a transistor having a vertical channel provided by the pillar 112. In one active region 100a, a pair of pillars 112 adjacent to each other on opposite sides of one first impurity region 128 may share the one first impurity region 128.

A plurality of first contact plugs 130 may be formed on the active region 130. The plurality of first contact plugs 130 may be connected to the first impurity regions 128 while being spaced apart from the word lines 120, respectively.

A plurality of bit lines 140 may extend in the first direction on the plurality of first contact plugs 130. The bit line 140 may be connected to the first impurity regions 128 through the first contact plugs 130. The bit line 140 may be positioned between two active regions 100a adjacent to each other among the plurality of active regions 100a, and may extend in the same extension direction as the active regions 100a.

A second contact plug (such as a second contact plug 160 that will be described later with reference to FIG. 8B) may be formed on each of the plurality of pillars 112. The second contact plug may extend to an opposite side to the semiconductor substrate in the same direction as an extension direction of the pillars 112, and a capacitor 170 may be connected to a second impurity region (such as a second impurity region 158 that will be described later with reference to FIG. 8B) formed on a top of the pillar 112 through the second contact plug that is formed on the second contact plug.

A distance from the semiconductor substrate to the capacitor 170 may be greater than that from the semiconductor substrate to the bit line 140.

In FIG. 1, the semiconductor memory device 10 may include plural lines in which the plurality of active region 100a extend in the first direction to be parallel with one another on the semiconductor substrate. However, embodiments of the present invention are not limited thereto. For example, the semiconductor memory device 10 may have a plurality of island-shaped active regions according to other embodiments of the present invention as described below with reference to FIGS. 11 and 12.

Figure 2A:
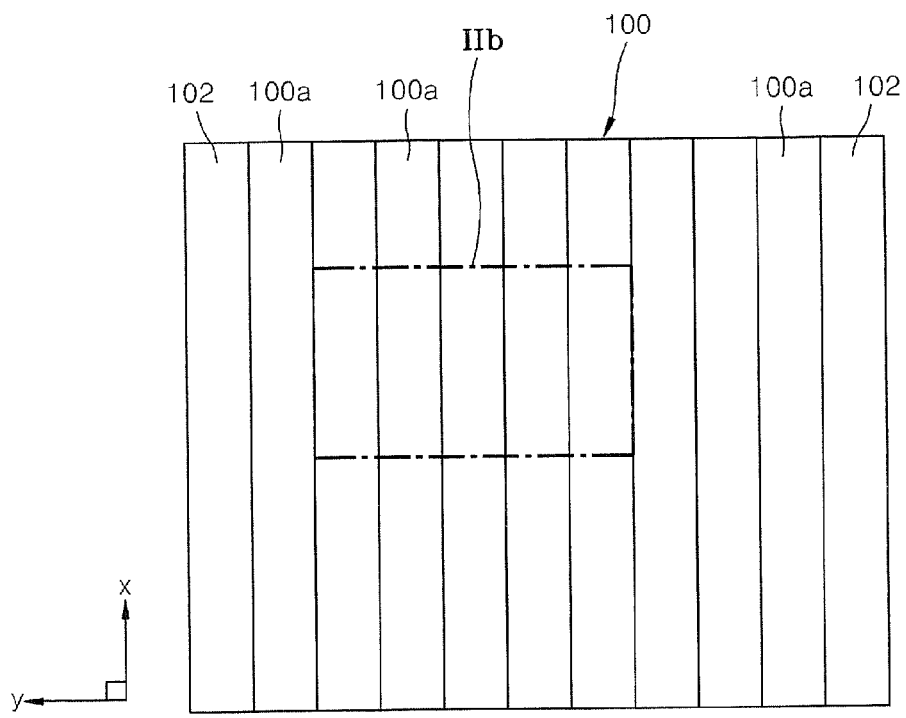
FIGS. 2A, 3A, . . . , and 9A are respectively plan views sequentially illustrating steps of manufacturing the semiconductor memory device of FIG. 1 according to embodiments of the present invention.
Figure 2B:
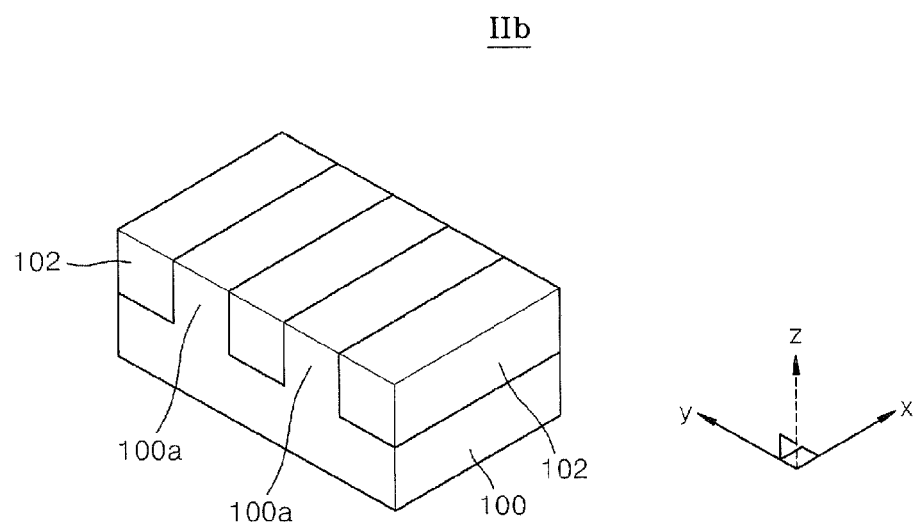
FIGS. 2B, 3B, . . . , and 9B are partially cut-out perspective views of FIGS. 2A, 3A, . . . , and 9A, respectively.
Figure 3A:
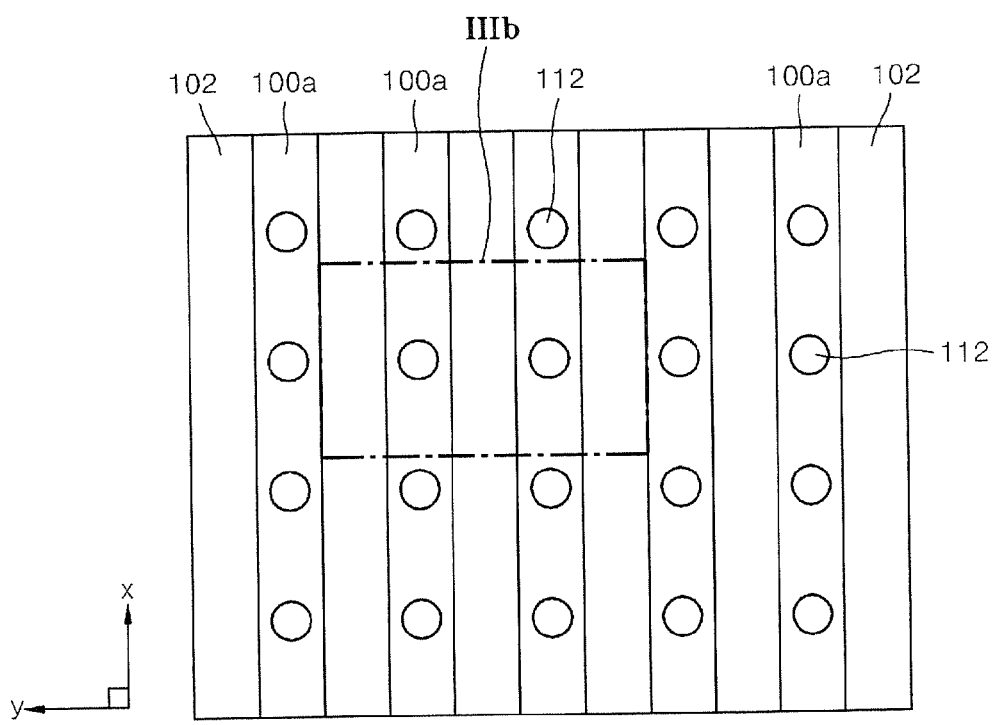
Figure 3B:
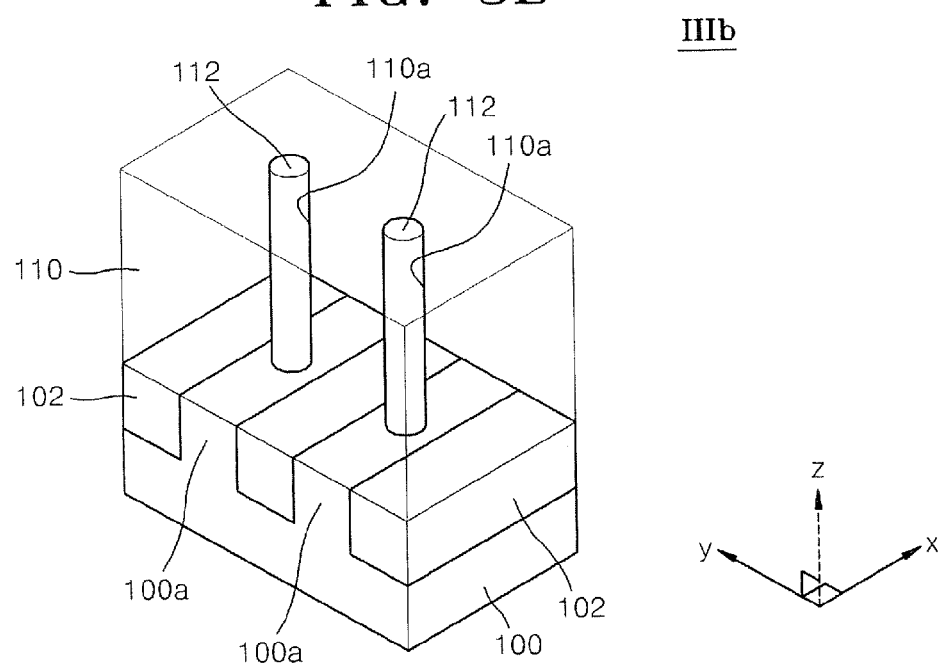

FIGS. 2A, 3A, . . . , and 9A are plan views sequentially illustrating steps of manufacturing the semiconductor memory device 10 of FIG. 1 according to some embodiments of the present invention. FIGS. 2B, 3B, . . . , and 9B are partially cut-out perspective views of FIGS. 2A, 3A, . . . , and 9A, respectively.

Referring to FIGS. 2A and 2B, a plurality of active regions 100a extending in a first direction (the x direction) may be defined on a semiconductor substrate 100, e.g., a silicon substrate. For example, a device isolation layer 102 may define the plurality of active regions 100a. The device isolation layer 102 may be formed by patterning the semiconductor substrate 100 in the form of lines and spaces, forming an insulating layer in the spaces, and then performing chemical mechanical polishing (CMP).

Referring to FIGS. 3A and 3B, a first interlayer dielectric layer 110 may be formed and planarized to cover the active regions 100a and the device isolation layer 102. Thereafter, a plurality of first holes 110a may expose a plurality of regions of the active regions 100a, and a semiconductor material may be formed in the plurality of first holes 110a, thereby forming a plurality of pillars 112. The pillars 112 may extend in a direction (the z direction) perpendicular with respect to an extension direction of a major surface of the semiconductor substrate 100. To form the pillar 112, a Si epitaxial layer may be grown in the first hole 110a, for example, by performing a selective epitaxial growth (SEG) process and/or by depositing amorphous Si and then annealing the deposited amorphous Si and/or crystallizing the deposited amorphous Si using laser. The Si epitaxial layer may be in-situ doped with a P-type impurity and/or doped with a P-type impurity using an ion implantation process performed after the Si epitaxial layer is completely grown. Chemical Mechanical Polishing (CMP) may be performed with respect to the Si epitaxial layer so that a top surface of the pillar 112 is formed at a same level as that of the first interlayer dielectric layer 110.

Figure 4A:
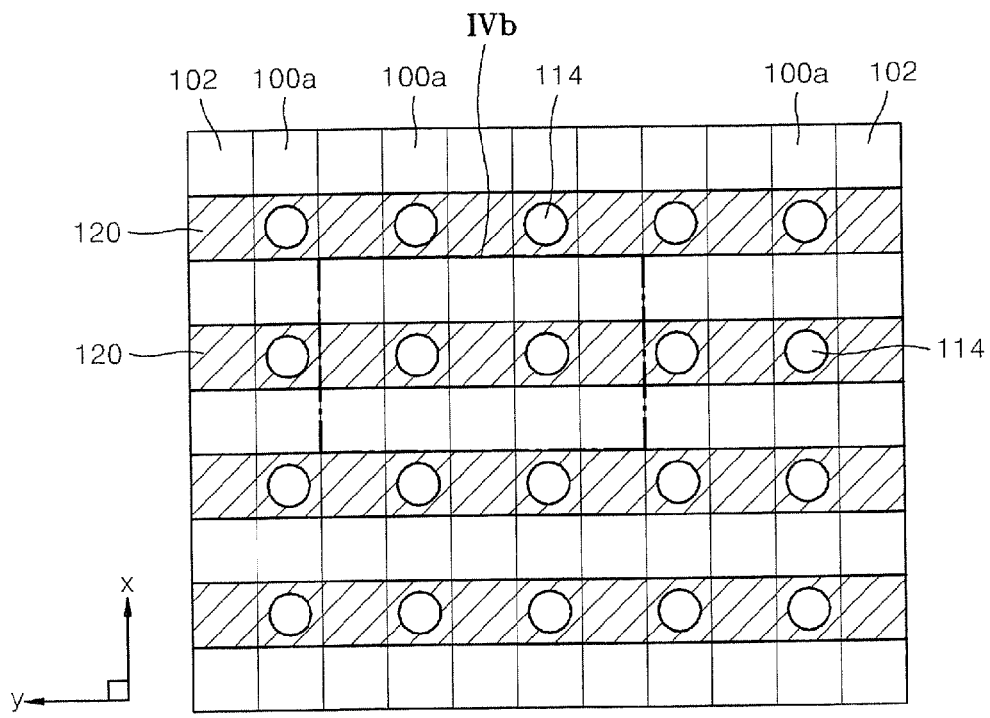
Figure 4B:
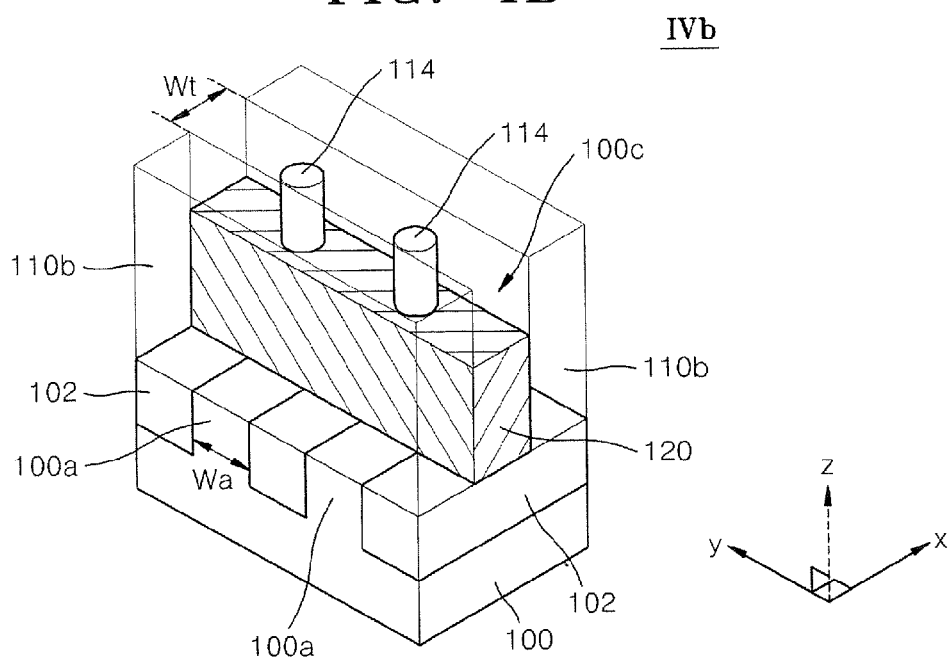

Referring to FIGS. 4A and 4B, the first interlayer dielectric layer 110 may be patterned using a photolithography process, thereby forming a plurality of first interlayer dielectric layer patterns 110b. A plurality of line-shaped trenches 110c may be formed simultaneously exposing a plurality of pillars 112 arranged in a line in a second direction (the y direction) perpendicular to a first direction (the x direction) and exposing portions of active regions 100a around the pillars 112 to form first interlayer dielectric layer patterns 110b. A width Wt of the trench 100c along the first direction (the x direction) may be equal to or narrower than a width Wa of the active region 100a along the second direction (the y direction).

A trimming process may be performed to reduce a width of each of the pillars 112 exposed in the trench 110c. To this end, surface portions of the plurality of pillars 112 exposed in the trench 100c may be oxidized and oxidized portions of the pillars 112 may be removed using a wet etch, for example. After trimming the pillars 112, a width and a height of the pillars 112 may be reduced. The pillars 112 may be trimmed so that a width of the word line formed on the pillars 112 can be reduced. As a result, an insulation margin between adjacent conductive lines may be provided. In addition, a sectional area perpendicular to a movement direction of carriers may be reduced in a channel region provided by the pillar 112, so that full depletion (FD) characteristics may be improved in operation of a transistor. Trimming of the pillars 112 may be omitted according to other embodiments of the present invention.

Thereafter, a first insulating layer 114 for a gate insulating layer may be formed on surfaces of the plurality of pillars 112 exposed through the trenches 110c. To form the first insulating layer 114, the exposed surfaces of the pillars 112 may be oxidized or the exposed surfaces of the pillars 112 may be oxidized and then nitrified. Exposed surfaces of the active regions 100a may be simultaneously oxidized or oxidized and then nitrified together with exposed surfaces of the pillars 112. According to other embodiments of the present invention, the first insulating layer 114 may include a layer of an insulating material an insulating layer such as $SiO_2$ or SiON, or a high dielectric layer such as $Al_2O_3$ or $HfO_2$ may be formed, for example, using atomic layer deposition (ALD).

A conductive material for a gate electrode may be deposited and then etched back, thereby forming a word line 120 having a lower height than that of a top surface of the first interlayer dielectric layer pattern 110b in the trench 110c. As a result, upper portions of the pillars 112 covered by the first insulating layer 114 may be exposed on the word line 120 in the trench 110c. The word line 120 may be formed to extend in the second direction (the y direction) while surrounding sidewalls of the plurality of pillars 112 on the first insulating layer 114. The word line 120 may be made of, for example, TiN or doped poly-silicon.

Figure 5A:
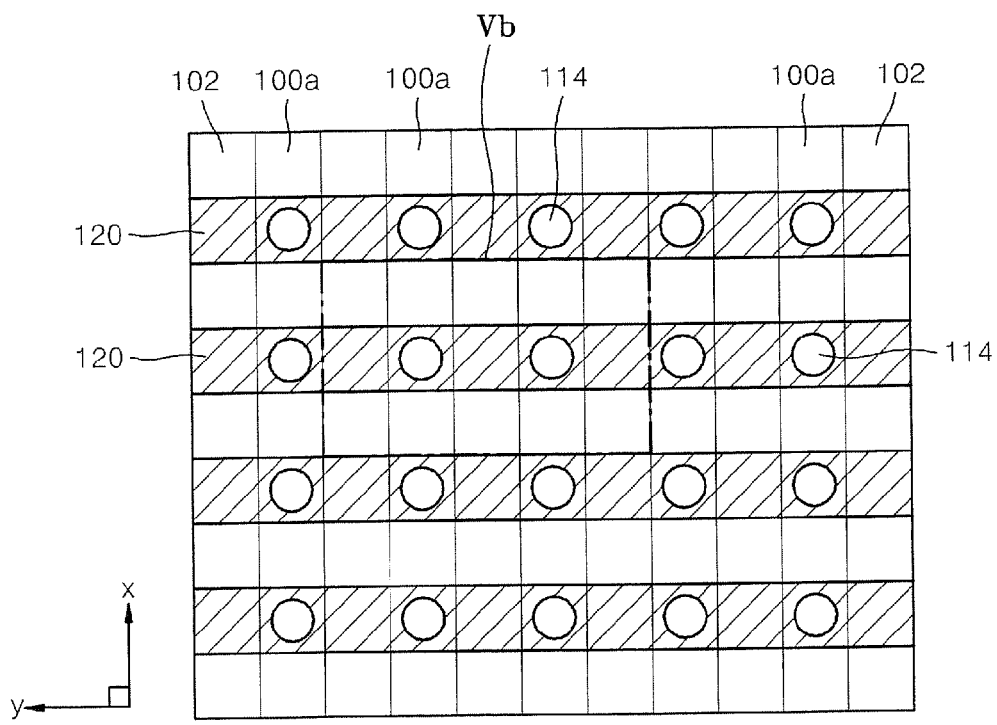
Figure 5B:
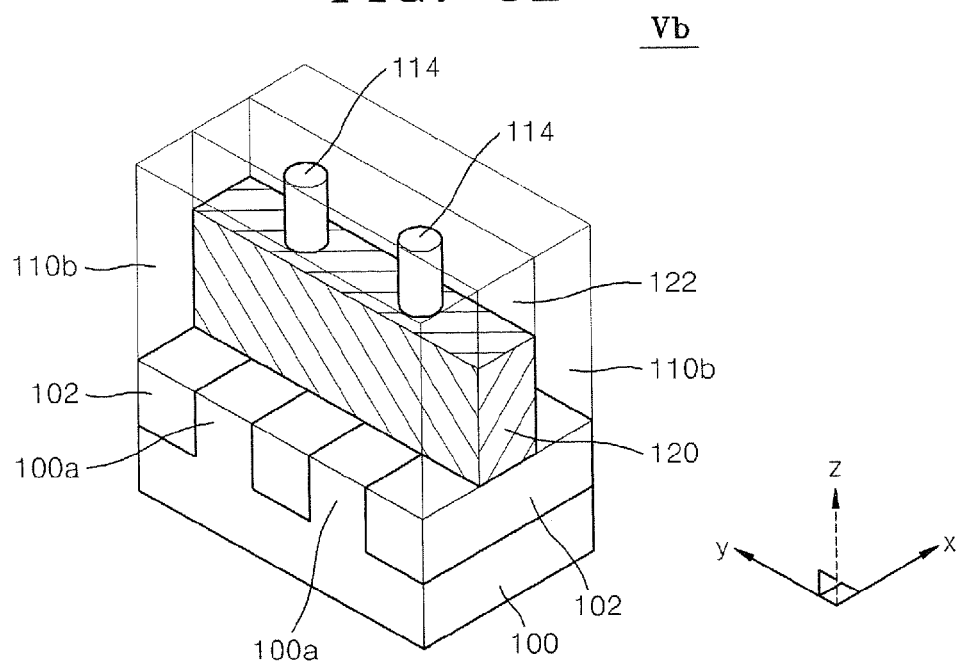

Referring to FIGS. 5A and 5B, an insulating material may be deposited to completely fill remaining portions of the trench 110c on the word line 120 and around the pillars 112 covered by the first insulating layer 114. A CMP and/or etch-back may then be performed with respect to the insulating material so that top surfaces of the first interlayer dielectric layer pattern 110b are exposed, thereby forming a second insulating layer 122 in the trench 110b.

Figure 6A:
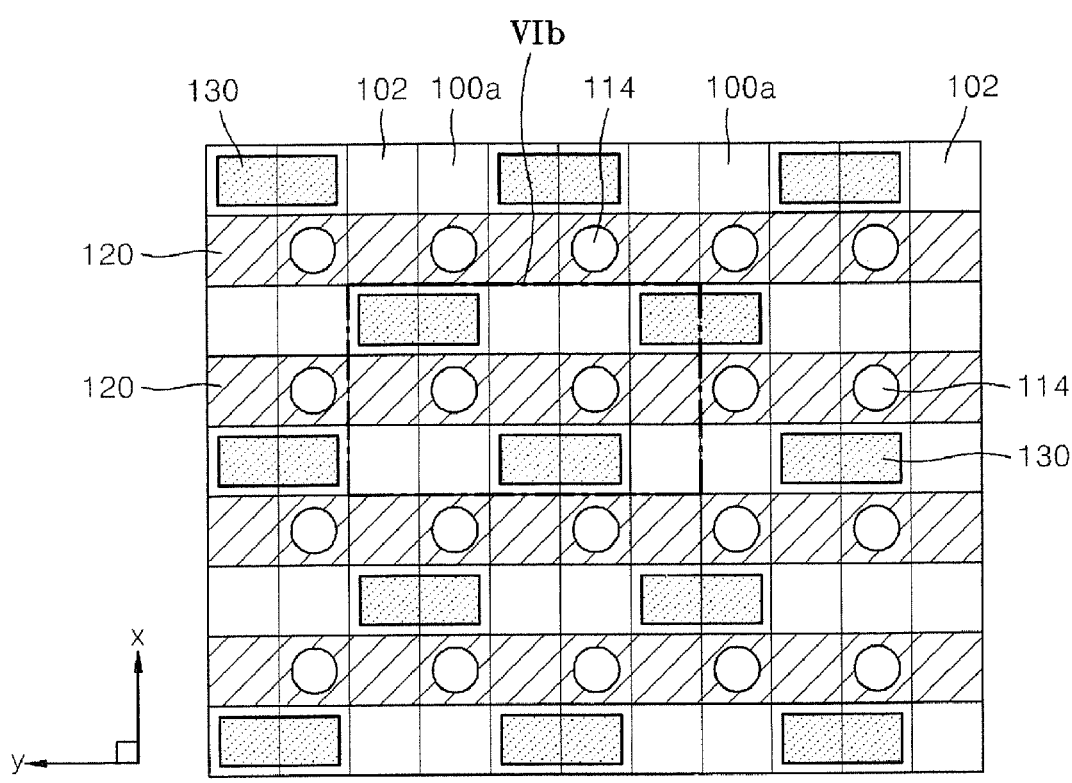
Figure 6B:
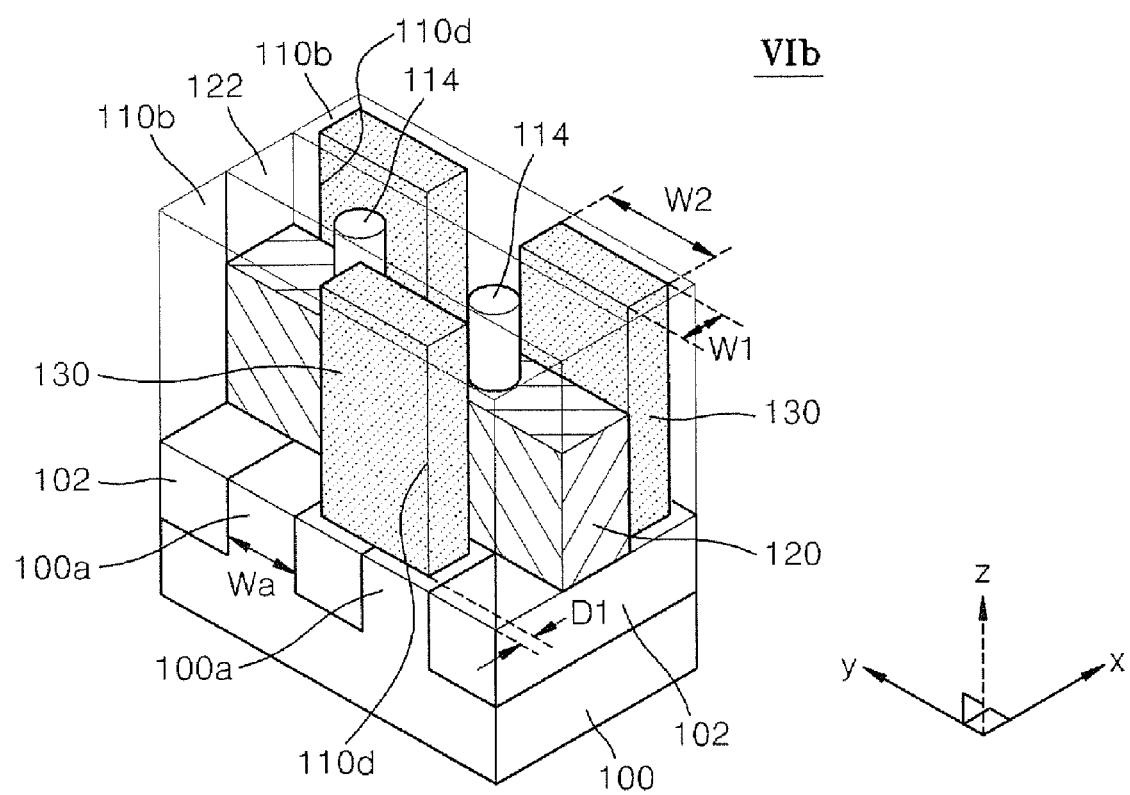

Referring to FIGS. 6A and 6B, portions of the first interlayer dielectric layer pattern 110b may be etched using a photolithography process, thereby forming a plurality of second holes 110d exposing a respective plurality of regions spaced apart from the word line 120 at a predetermined distance, e.g., distance D1 in FIG. 6B. In FIGS. 6A and 6B, the second holes 110d may be formed in a rectangular shape. However, embodiments of the present invention are not limited thereto. For example, the second holes 110d may be formed in elliptic or circular shapes.

Ion implantation may be performed with respect to each region exposed through the second holes 110d in the active regions 100a, thereby forming first impurity regions 128 (see FIG. 1). To form the first impurity region 128, an $N^+$ region may be formed by implanting an N-type impurity ion, e.g., P or As. Alternatively, to form the first impurity region 128, a $P^+$ region may be formed by implanting a P-type impurity ion, e.g., B in some cases. The first impurity region 128 may serve as a source and/or drain of a transistor having a vertical channel provided by the pillar 112.

A conductive material may be deposited on the semiconductor substrate 100 to completely fill in the second holes 110d on the first impurity region 128, and a CMP (chemical mechanical polish) and/or etchback is then performed with respect to the conductive material until top surfaces of the first interlayer dielectric layer pattern 110b and the second insulating layer 122 are exposed, thereby forming first contact plugs 130 in the second holes 110d. The first contact plug 130 may connect a bit line (see a bit line 170 of FIG. 7B formed in a subsequent process) to the active region 100a.

The first contact plug 130 may have a first width W1 along the first direction (the x direction) and a second width W2 along the second direction (the y direction). The first width W1 of the first contact plug 130 may be formed to be equal to or narrower than the width Wa of the active region 100a along the second direction (the y direction). The second width W2 may be formed to be equal to or narrower than two times of the width Wa of the active region 100a along the second direction (the y direction).

Figure 7A:
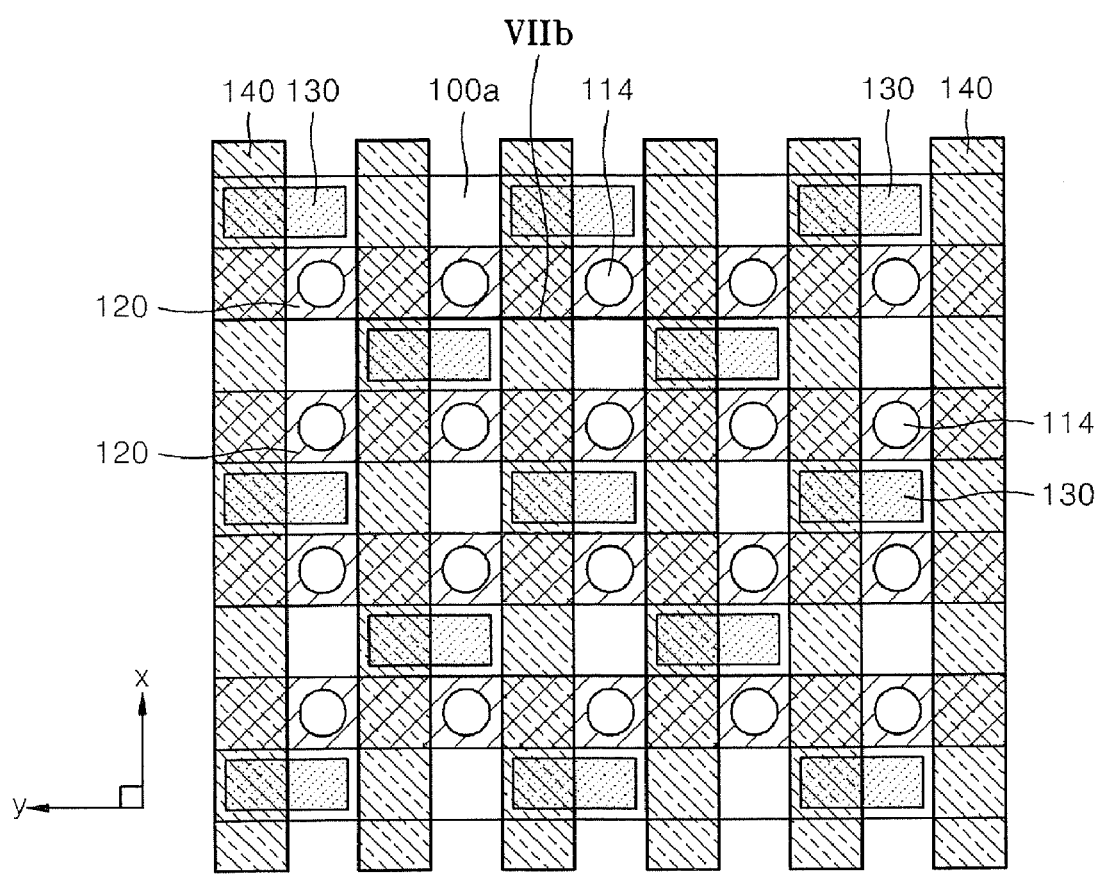
Figure 7B:
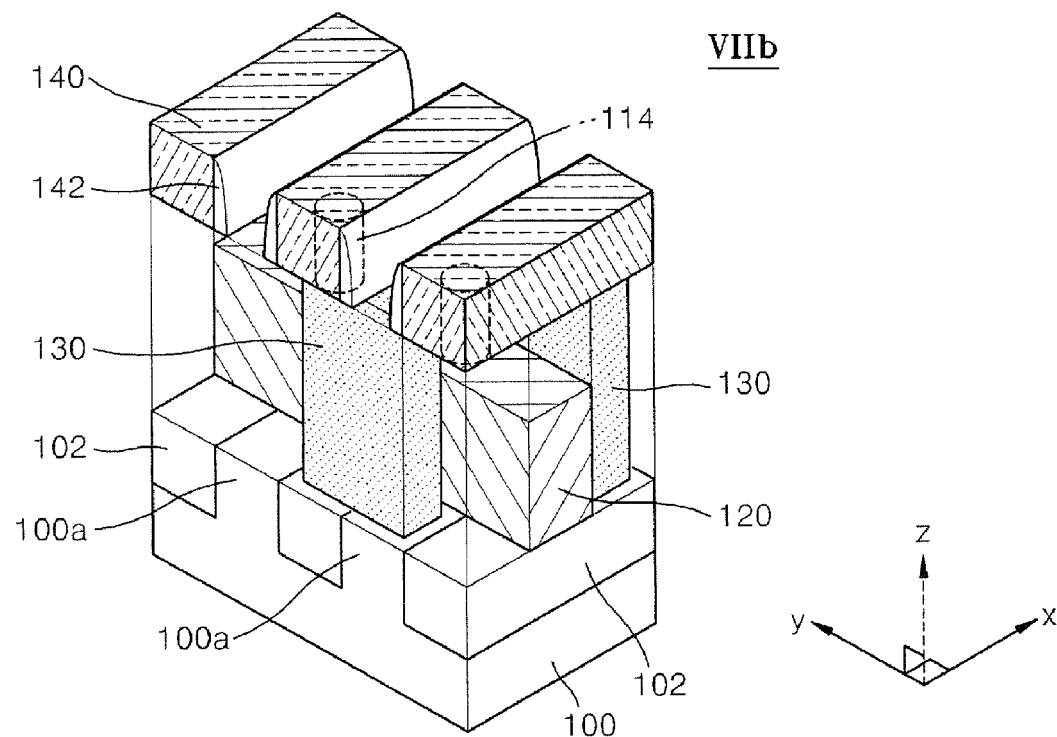

Referring to FIGS. 7A and 7B, a conductive layer for a bit line may be formed on top surfaces of the first contact plugs 130 and the first interlayer dielectric layer patterns 110b and then patterned, thereby forming a plurality of bit lines 140. Thereafter, an insulating layer, (e.g., a silicon nitride layer) may be formed on the plurality of bit lines 140 and then etched back, thereby forming an insulating spacer 142 on each sidewall of the plurality of bit lines 140.

The plurality of bit lines 140 may be formed into a plurality of line patterns parallel with respect to one another while extending in the first direction (the x direction) on the first contact plugs 130. The bit line 140 may be connected to the first impurity region 128 through the first contact plug 130.

Each of the plurality of bit lines 140 may be formed on a respective first contact plug 130 in a region between two adjacent active regions 100a among the plurality of active regions 100a.

In FIG. 7B, each bit line 140 may be formed into a line pattern having a rectangular cross section including a bottom surface, both side surfaces and a top surface. In addition, a bit line 140 may come in contact with a first contact plug 130 only at a bottom surface thereof. However, the present invention is not limited thereto. For example, a bit line 140 may come in contact with a first contact plug 130 not only at a bottom surface but also at a side surface so as to provide a broader contact area as described in detail later with respect to FIGS. 24A through 24E.

In FIGS. 7A and 7B, the plurality of bit lines 140 may be formed by forming a conductive layer on the semiconductor substrate 100 and the first contact plugs 130 and then patterning the conductive layer. However, the present invention is not limited thereto. For example, a damascene process using an insulating mold layer pattern (not shown) may be applied to form the plurality of bit lines 140. More specifically, a process may be used, in which an insulating mold layer pattern (not shown) defining a plurality of space lines including regions formed with the bit lines 140 is formed on the semiconductor substrate 100, insulating spacers are formed on both sidewalls of the insulating mold layer pattern exposed to an inside of each of the space lines, and an insulating substance is deposited in the plurality of space lines, thereby forming a plurality of bit lines. A process similar to the aforementioned process will be described later with reference to FIGS. 24A through 24E.

The bit line 140 may be formed of a metal such as W (Tungsten), a metallic nitride such as TiN (Titanium Nitride), or doped poly-silicon. Alternatively, the bit line 140 may be formed, for example, as a combination of a barrier layer having a Ti/TiN stacked structure and a metal layer. When the bit line 140 is formed through the damascene process described above, the bit line 140 may be formed into a Cu and/or Ti/TiN/W stacked structure. Alternatively, the bit line 140 may be formed as a combination of the aforementioned structures and a metal silicide layer.

Figure 8A:
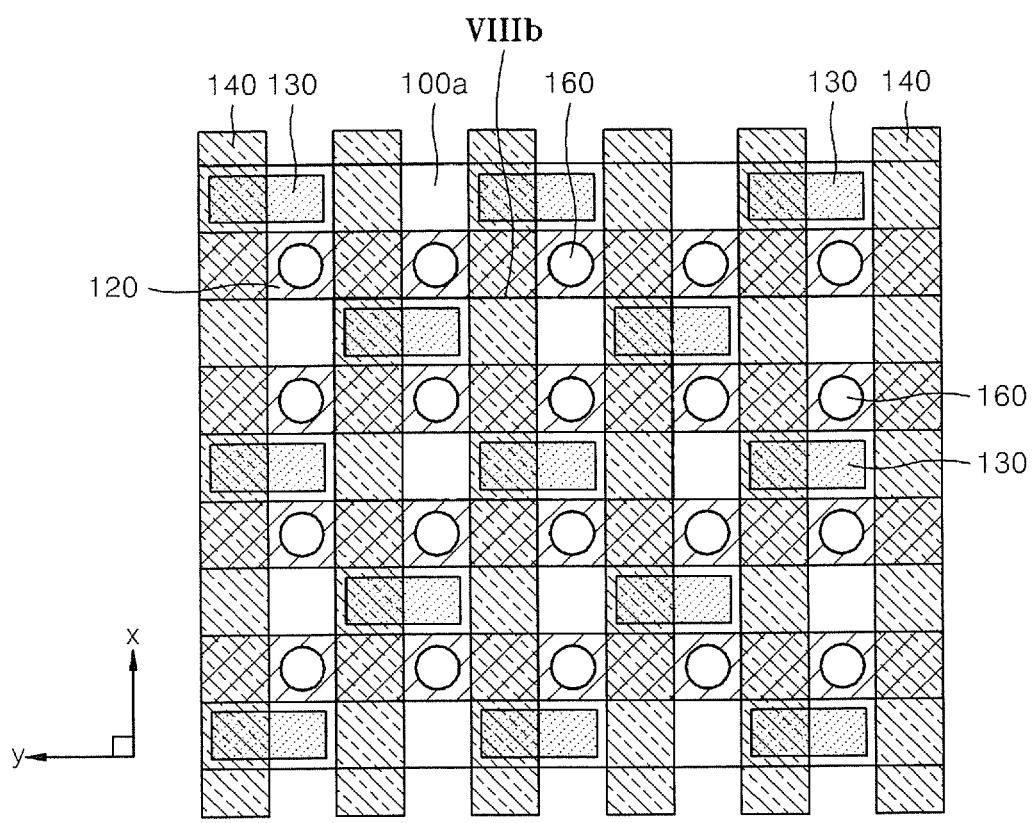
Figure 8B:
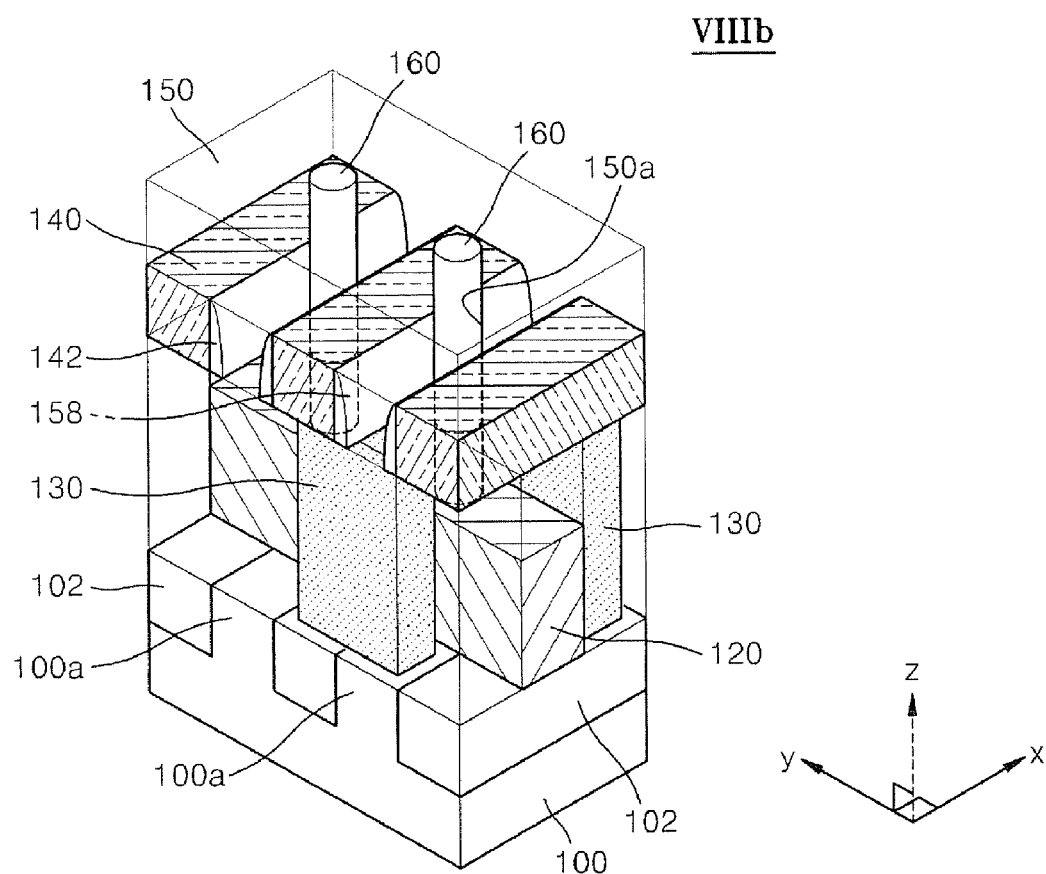

Referring to FIGS. 8A and 8B, a planarized second interlayer dielectric layer 150 covering the bit lines 140 may be formed on an entire surface of the resulting structure including the bit lines 140.

Thereafter, a plurality of third holes 150a respectively exposing top surfaces of the plurality of pillars 112 may be formed by etching a portion of the second interlayer dielectric layer 150, a portion of the first interlayer dielectric layer pattern 110b covering the plurality of pillars 112 and a portion of the first insulating layer 114 using a photolithography process.

Second impurity regions 158 may be formed by performing Ion implantation with respect to upper portions of the plurality of pillars 112 exposed through the third holes 150a, respectively. To form the second impurity regions 158, an N$^+$ region may be formed by implanting an N-type impurity ion, e.g., P or As. Alternatively, to form the second impurity region 158, a P$^+$ region may be formed by implanting a P-type impurity ion, e.g., B in some cases. The second impurity regions 158 may serve as sources and/or drains of transistors having vertical channel regions provided by the pillar 112.

A conductive material may be positioned on the semiconductor substrate 100 so that the third holes 150a are completely filled with the conductive material and a CMP and/or etchback may be performed with respect to the conductive material until the top surface of the second interlayer dielectric layer 150 is exposed, thereby forming second contact plugs 160 in the third holes 150a. The second contact plugs 160 may connect lower electrodes of respective capacitors (formed in a subsequent process) to the active region 100a.

For example, the second contact plug 160 may be formed of a metal such as W (Tungsten), or doped poly-silicon.

Figure 9A:
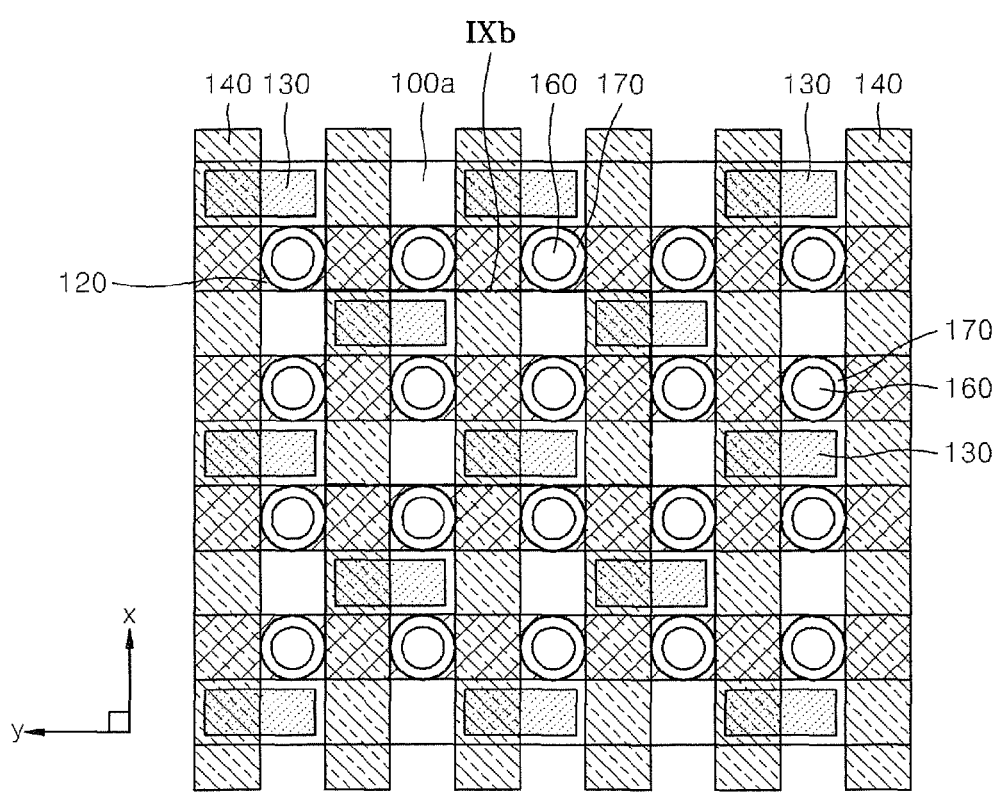
Figure 9B:
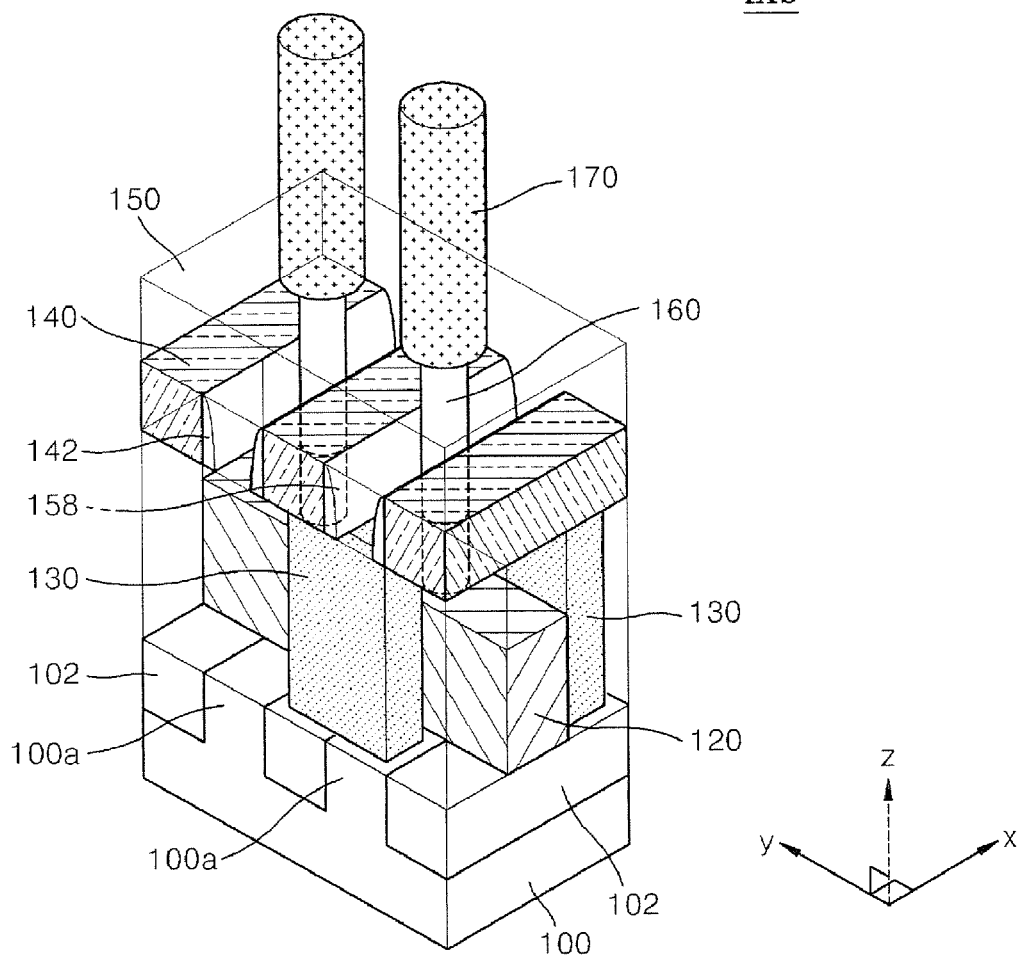

Referring to FIGS. 9A and 9B, lower electrodes (not shown) respectively connected to the second contact plugs 160 may be formed on the resulting structure having the second contact plugs 160, and dielectric layers and upper electrodes, covering each of the lower electrodes, may be sequentially formed, thereby forming capacitors 170 connected to the second contact plugs 160.

According to methods of manufacturing the semiconductor memory device 10 according to embodiments of the present invention as described above, a highly integrated semiconductor device having vertical channel transistors may be provided to implement a highly integrated semiconductor memory device scaled to a high degree. Moreover, an open bit line structure may be used with bit lines 140 formed on word lines 120 opposite to the semiconductor substrate 100, or a stacked bit line structure without using a buried diffusion bit line. Thus, bit lines 140 can be formed of a metal having a relatively low resistance, thereby increasing data transmission speed and/or access time of the device. Accordingly, methods for manufacturing semiconductor memory devices discussed above can be effectively applied to memory devices such as DRAMs.

Figure 10:
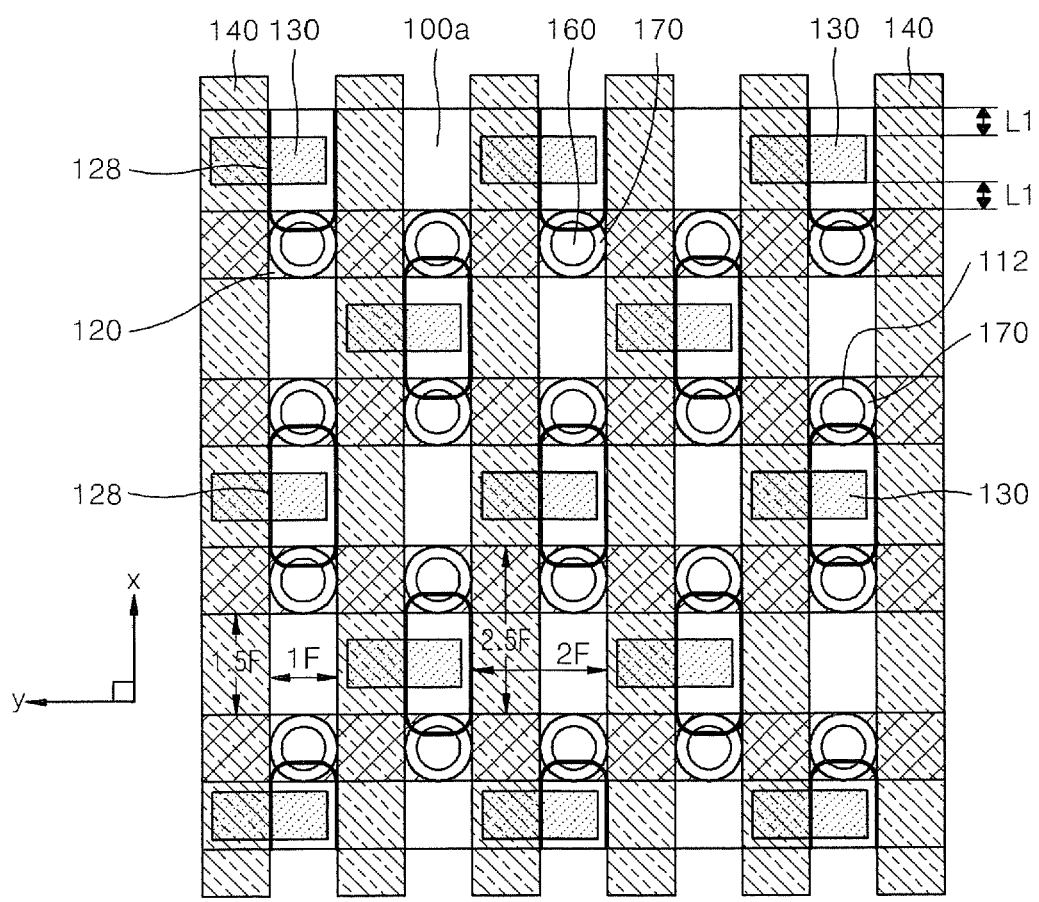
FIG. 10 is a plan view of a semiconductor memory device according to other embodiments of the present invention.

FIG. 10 is a layout of a semiconductor memory device 20 according to other embodiments of the present invention. The layout illustrated in FIG. 10 has a configuration similar to that of the semiconductor memory device 10 illustrated in FIG. 1, except that the layout illustrated in FIG. 10 is applied in a memory cell having a unit cell size of 5F$^2$. In FIG. 10, reference numerals the same as those of FIG. 1 designate corresponding elements. Hence, detailed descriptions of the corresponding elements will be omitted for the sake of conciseness.

In FIG. 10, the size of a unit cell along the x direction may be designed to be 2.5F, so that a distance L1 between a word line 120 and a first contact plug 130 is greater than that when the size of the unit cell of FIG. 1 along the x direction is 2F. Thus, an insulation distance between the word line 120 and the first contact plug 120 may increase thereby reducing a possibility of short circuits between the word line 120 and the first contact plug 130.

Figure 11:
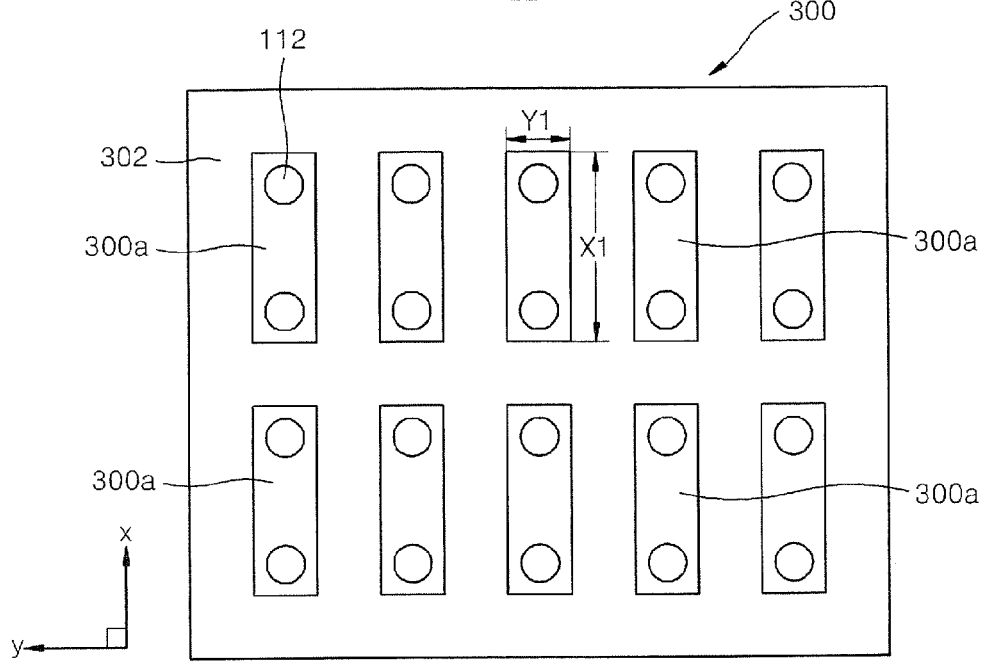
FIG. 11 is a plan view illustrating some elements of a semiconductor memory device according to still other embodiments of the present invention.

FIG. 11 is a plan view illustrating some elements of a semiconductor memory device 30 according to still other embodiments of the present invention.

In FIG. 11, a plurality of active regions 300a are illustrated having a configuration that may be applied as a modification of the semiconductor memory device 10 according to the layout illustrated in FIG. 1 or as a modification of the method for manufacturing the semiconductor memory device 10 described with reference to FIGS. 2A to 9A, and FIGS. 2B to 9B. The plurality of active regions 300a illustrate a modification of the shape and arrangement of the plurality of active regions 100a illustrated in the layout of FIG. 3A. In FIG. 11, reference numerals the same as those of FIG. 1 designate corresponding elements, and detailed description of the corresponding elements will be omitted for the sake of conciseness.

Referring to FIG. 11, the plurality of active regions 300a defined by a device isolation layer 302 on a semiconductor substrate 300 may include a plurality of island-shaped active regions each having a major axis extending in a first direction (the x direction) and a minor axis extending in a second direction (the y direction) perpendicular to the first direction. A length X1 of the major axis of the active region 300a in the first direction (the x direction) may be greater than a length Y1 of the minor axis of the active region 300a in the second direction (the y direction).

In FIG. 11, the plurality of active regions 300a may be repeatedly arranged in one line along the first direction (the x direction) and/or the second direction (the y direction).

Figure 12:
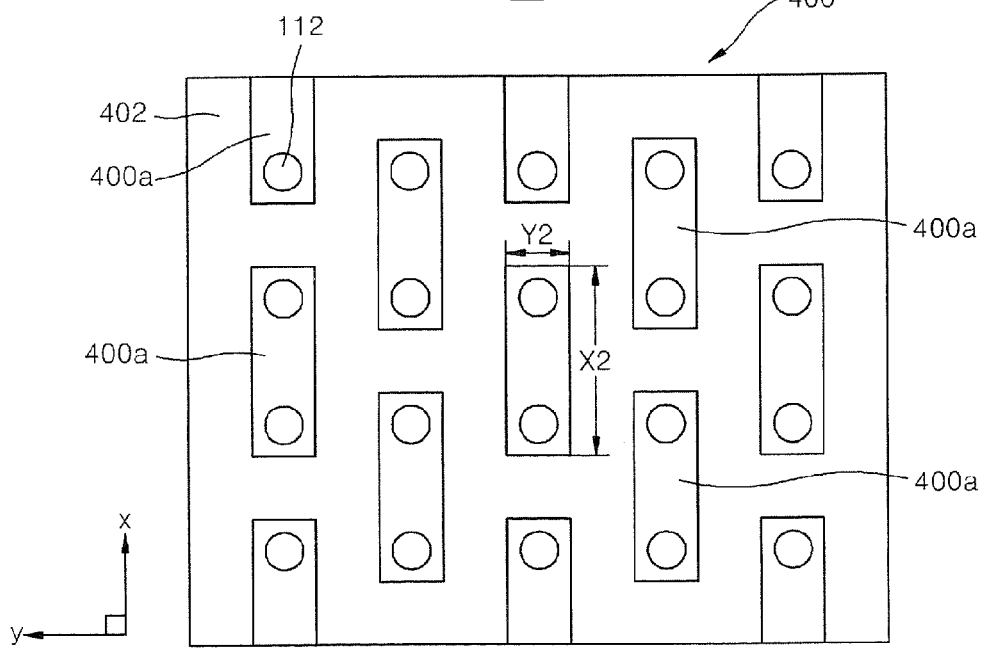
FIG. 12 is a plan view illustrating some elements of a semiconductor memory device according to still other embodiments of the present invention.

FIG. 12 is a plan view illustrating some elements of a semiconductor memory device 40 according to still other embodiments of the present invention.

In FIG. 12, a plurality of active regions 400a are illustrated having a configuration that may be applied as a modification of the semiconductor memory device 10 according to the layout illustrated in FIG. 1 or as a modification of the method for manufacturing the semiconductor memory device 10 described with reference to FIGS. 2A to 9A, and FIGS. 2B to 9B. The plurality of active regions 400a illustrate a modification of the shape and arrangement of the plurality of active regions 100a illustrated in the layout of FIG. 3A. In FIG. 12, reference numerals the same as those of FIG. 1 designate corresponding elements.

Referring to FIG. 12, the plurality of active regions 400a defined by a device isolation layer 402 on a semiconductor substrate 400 may include a plurality of island-shaped active regions each having a major axis extending in a first direction (the x direction) and a minor axis extending in a second direction (the y direction) perpendicular to the first direction. A length X2 of the major axis of the active region 400a in the first direction (the x direction) may be greater than a length Y2 of the minor axis of the active region 400a in the second direction (the y direction).

In FIG. 12, the plurality of active regions 400a may be repeatedly arranged in one line along the first direction (the x direction). However, the plurality of active regions 400a may be arranged in a zigzag pattern along the second direction (the y direction).

FIGS. 13 through 23 are partial cut-out perspective views sequentially illustrating operations/steps for manufacturing a semiconductor memory device according to still other embodiments of the present invention. In FIGS. 13 through 23, a cell array region CELL and a peripheral circuit and core region (hereinafter, referred to as only a "peripheral circuit region PERI") are shown together. The layouts of the respective cell array regions in FIGS. 13 through 23 may be similar to those illustrated in FIGS. 2A through 9A. Hence, layouts for each of the operations/steps is not illustrated in FIGS. 13 through 23.

Figure 13:
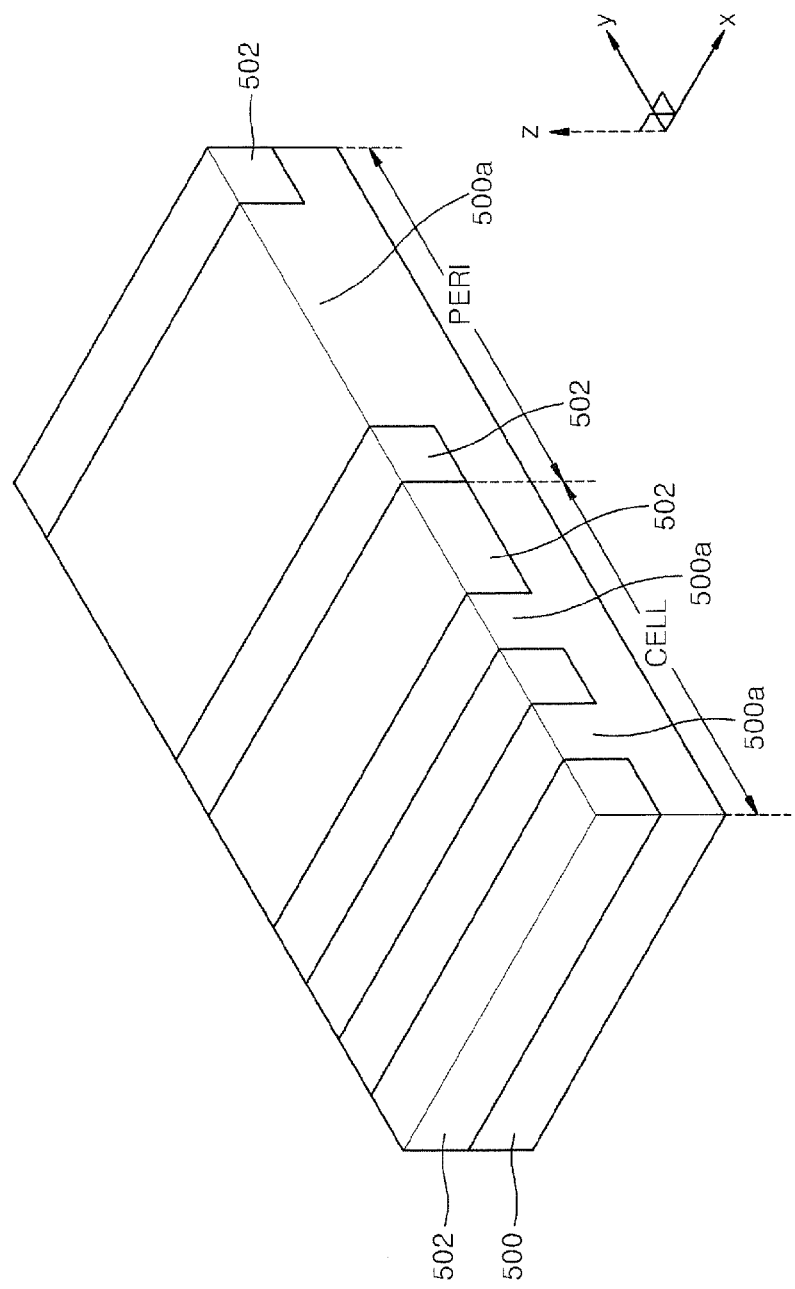
FIGS. 13 through 23 are partially cut-out perspective views sequentially illustrating steps of manufacturing a semiconductor memory device according to still other embodiments of the present invention.

Referring to FIG. 13, a semiconductor substrate 500 including a cell array region CELL and a peripheral circuit region PERI may be prepared. A plurality of active regions 500a extending in a first direction (the x direction) may be defined in each of the cell array region CELL and the peripheral circuit region PERI. For example, the plurality of active regions 500a may be defined, for example, by patterning the semiconductor substrate 500 in the form of lines and spaces, forming an insulating layer in the spaces, and performing chemical mechanical polishing (CMP) with the insulating layer, to thereby form a device isolation layer 502 defining the plurality of active regions 500a.

Figure 14:
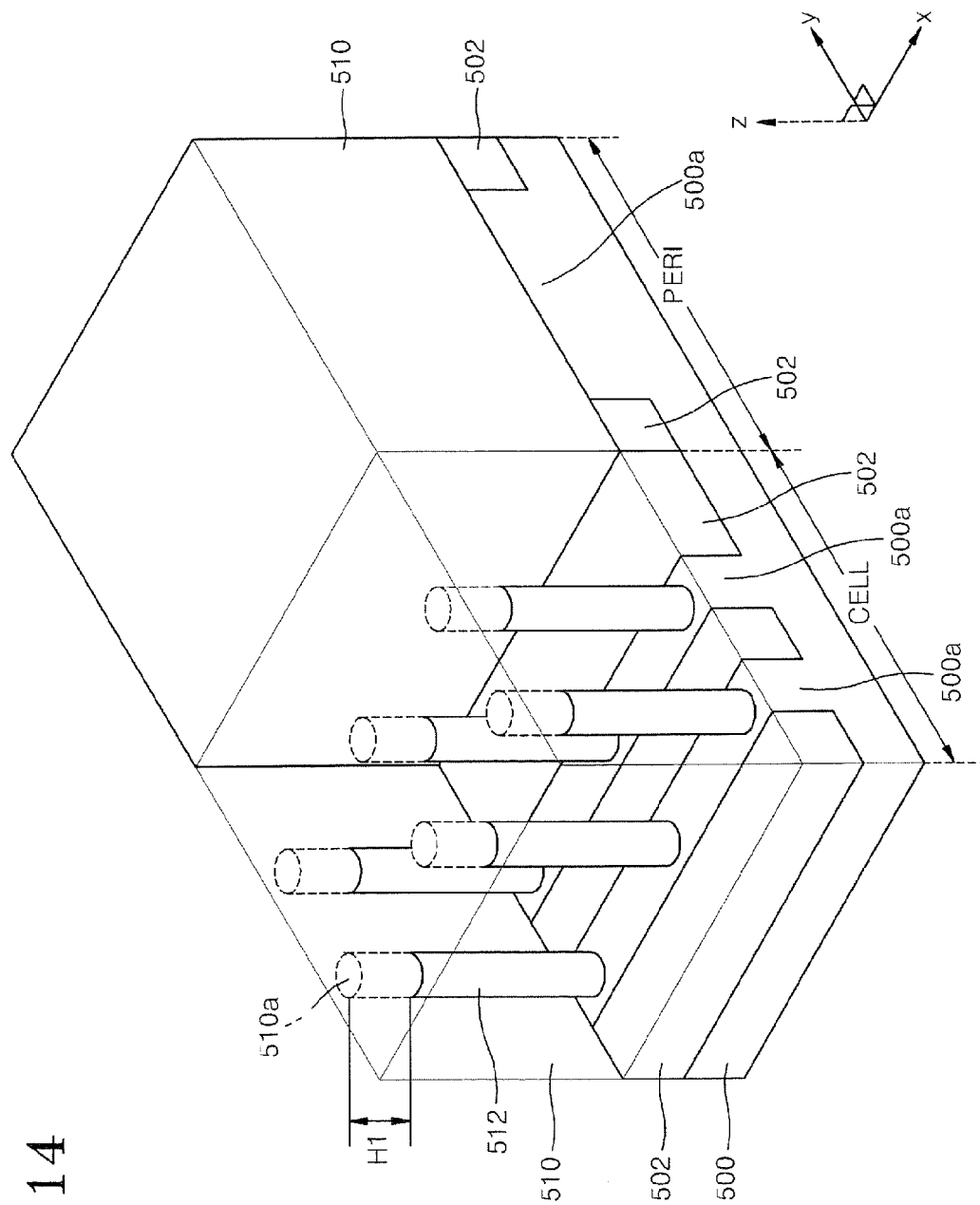

Referring to FIG. 14, a planarized sacrificial insulating layer 510 may be formed covering the active regions 500a and the device isolation layer 502 on the cell array region CELL and the peripheral circuit region PERI.

Thereafter, a plurality of first holes 510a may be formed exposing a plurality of regions isolated from one another only in the cell array region CELL. A plurality of pillars 512 may then be formed by filling a semiconductor material in the plurality of first holes 510a. The pillars 512 may extend in a vertical direction (the z direction) with respect to an extension direction of a major surface of the semiconductor substrate 500. For example, a method of forming the pillars, described with reference to FIGS. 3A and 3B, may be used to form the pillars 512.

In FIG. 14, a Si epitaxial layer may be formed in the first holes 510a, and CMP may be performed with respect to the Si epitaxial layer so that the Si epitaxial layer has the same top surface as that of the sacrificial insulating layer 510. After that, the Si epitaxial layer may be recessed by a first depth H1 from an entrance side of the first hole 510a so that a space having the first depth H1 may be provided on the pillars 512 at the entrance side of the first holes 510a.

Figure 15:
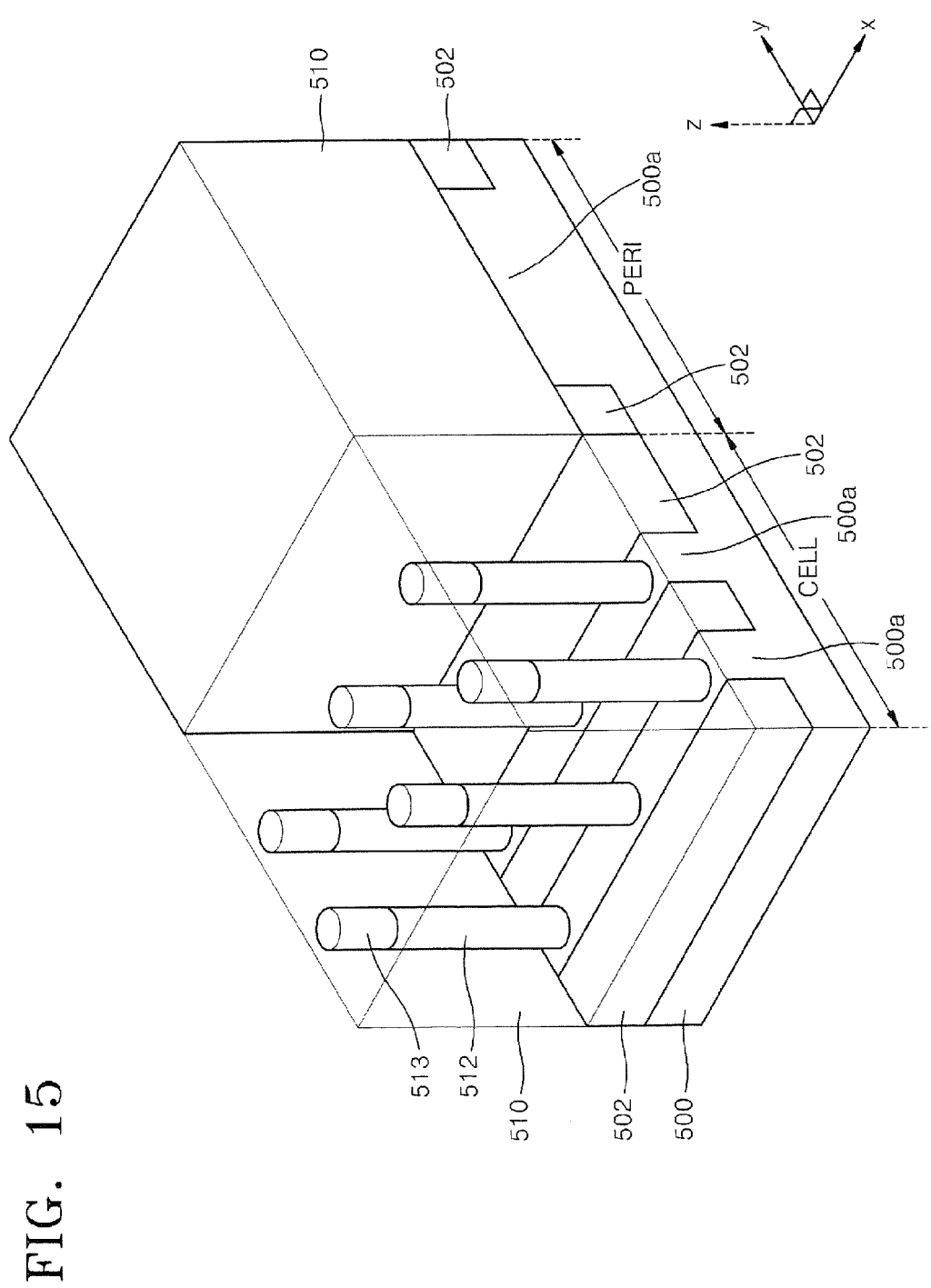

Referring to FIG. 15, protective layers 513 may be formed to fill in the spaces formed at upper portions of pillars 512 in the first holes 510a. For example, to form the protective layer 513, a silicon nitride layer may be formed on an entire surface of the structure having the pillars 512, and a CMP process may be performed with the silicon nitride layer so that the silicon nitride layer remains only in the first holes 510a.

The protective layer 513 may function to protect the top surfaces of the pillars 512 from being exhausted or damaged during subsequent etching and cleansing operations.

Figure 16:
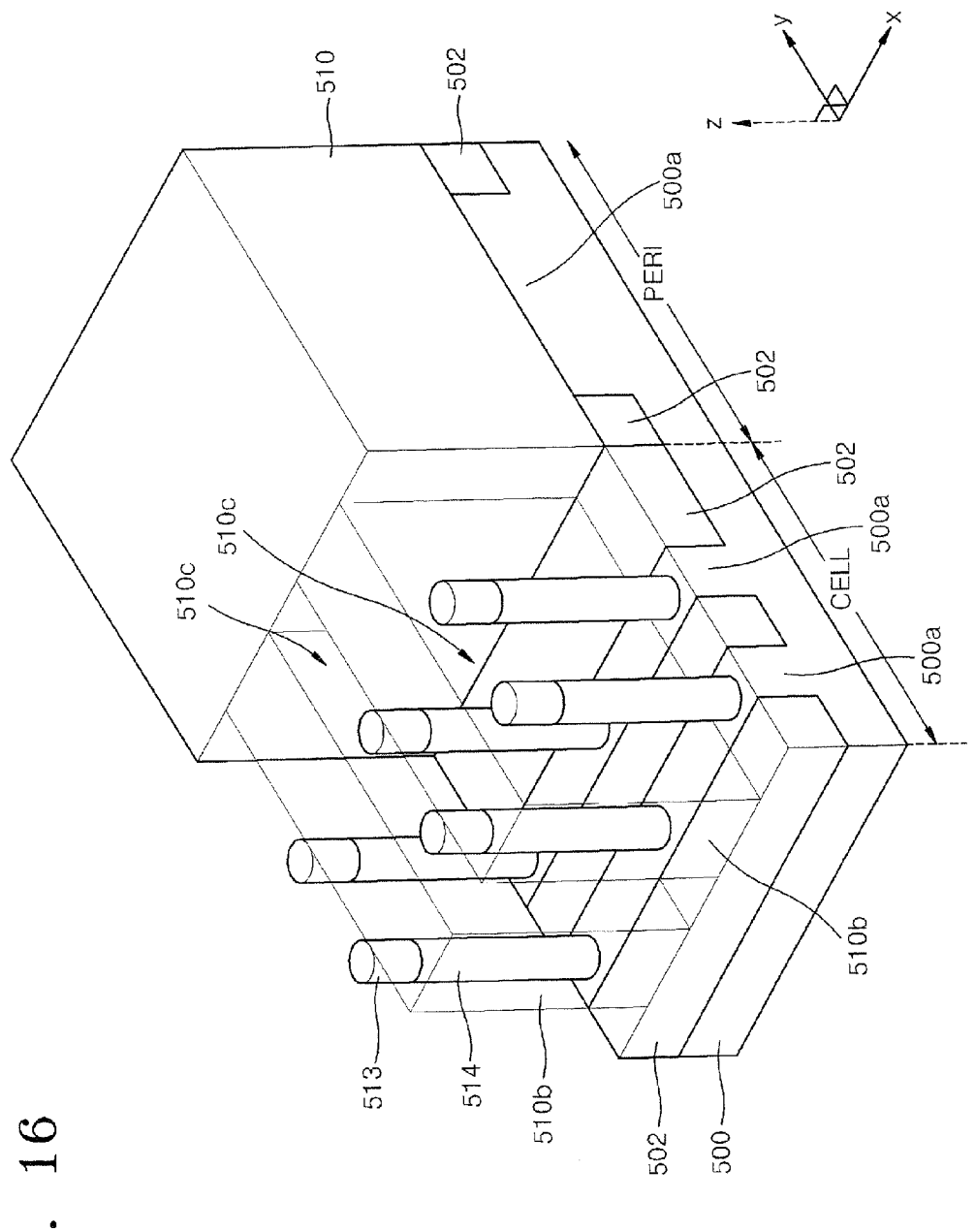

Referring to FIG. 16, a plurality of sacrificial insulating layer patterns 510b may be formed by patterning the sacrificial insulating layer 510 using a photolithography process only in the cell array region CELL with portions of the sacrificial layer 510 in the peripheral circuit region PERI covered by a mask layer (not shown). In the cell array region CELL, the plurality of pillars 512 and protective layers 513 may be arranged in respective lines in a second direction (the y direction) perpendicular to the first direction (the x direction). A plurality of line-shaped trenches 510c may expose portions of the active regions 500a around the plurality of pillars 512. The trenches 510c may be similar to the trenches 110c described with reference to FIGS. 4A and 4B.

Thereafter, a trimming process may be used to reduce a width of each of the plurality of pillars 512 exposed in the trenches 510c using operations described with reference to FIGS. 4A and 4B. At this time, because top surfaces of pillars 512 are covered by protective layers 513, widths of the pillar 512 may be reduced without reducing heights of the pillars 512 after performing trimming the pillars 512. Trimming of the pillars 512 may be omitted according to other embodiments of the present invention.

Thereafter, a first insulating layer 514 used to form a gate insulating layer is formed on surfaces of the plurality of pillars 512 exposed through the trenches 510c. At this time, the first insulating layer 514 may also be formed on surfaces of the active regions 500a. Forming the first insulating layer 514 may be the same as forming the first insulating layer 114, described with reference to FIGS. 4A and 4B.

Figure 17:
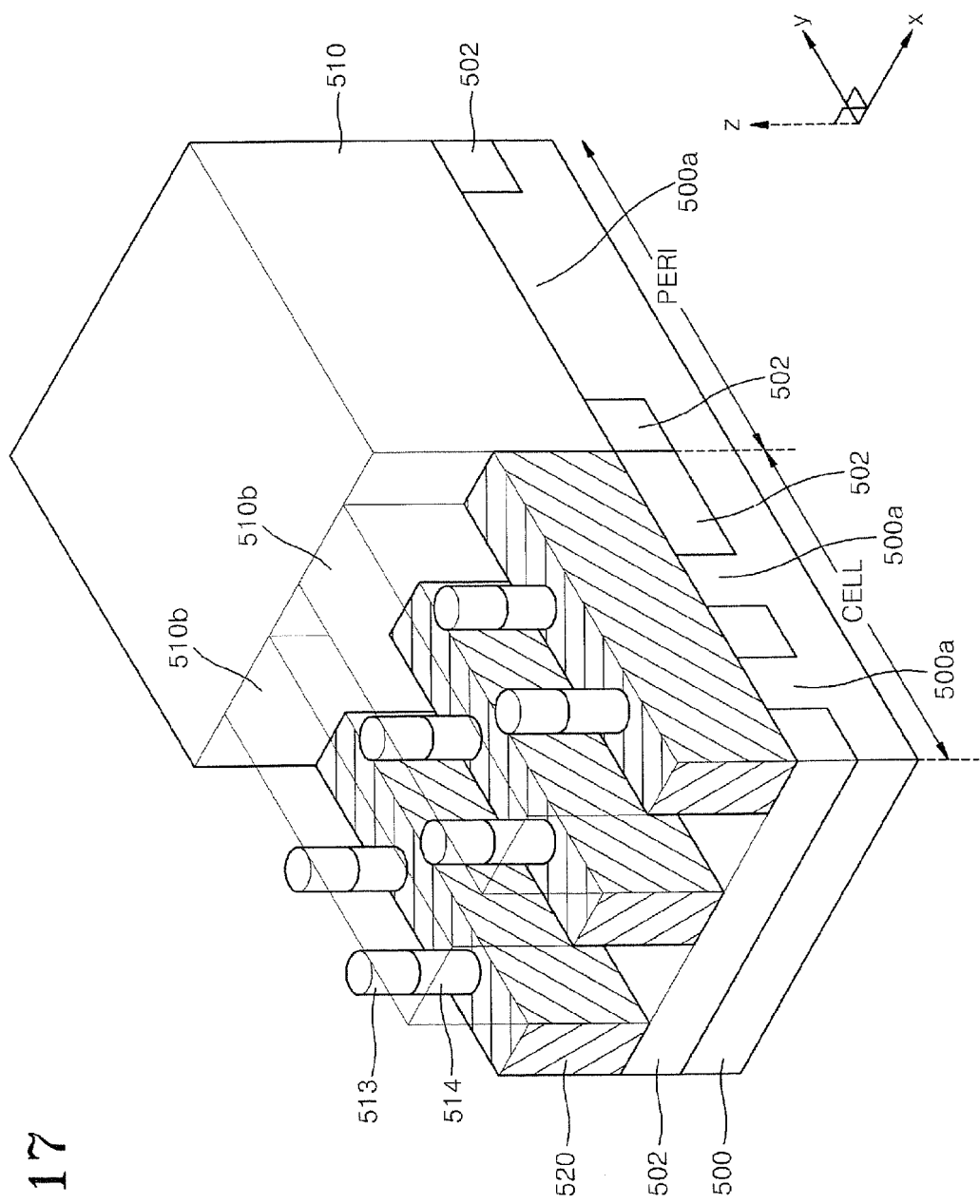

Referring to FIG. 17, in the cell array region CELL, word lines 520 (each having a height lower than that of the top surface of the sacrificial insulating layer pattern 510b in the trench 510c) may be formed by depositing a conductive material for gate electrodes on the structure having the first insulating layer 514 and then etching back the conductive material. As a result, the protective layer 513 and an upper portion of the pillar 512 covered by the first insulating layer 514 may protrude beyond the word line 520 in the trench 510c. The word line 520 may be formed to extend in the second direction (the y direction) while surrounding sidewalls of the plurality of pillars 512 on the first insulating layer 514. The word line 520 may be formed of TiN and/or doped poly-silicon, for example.

Figure 18:
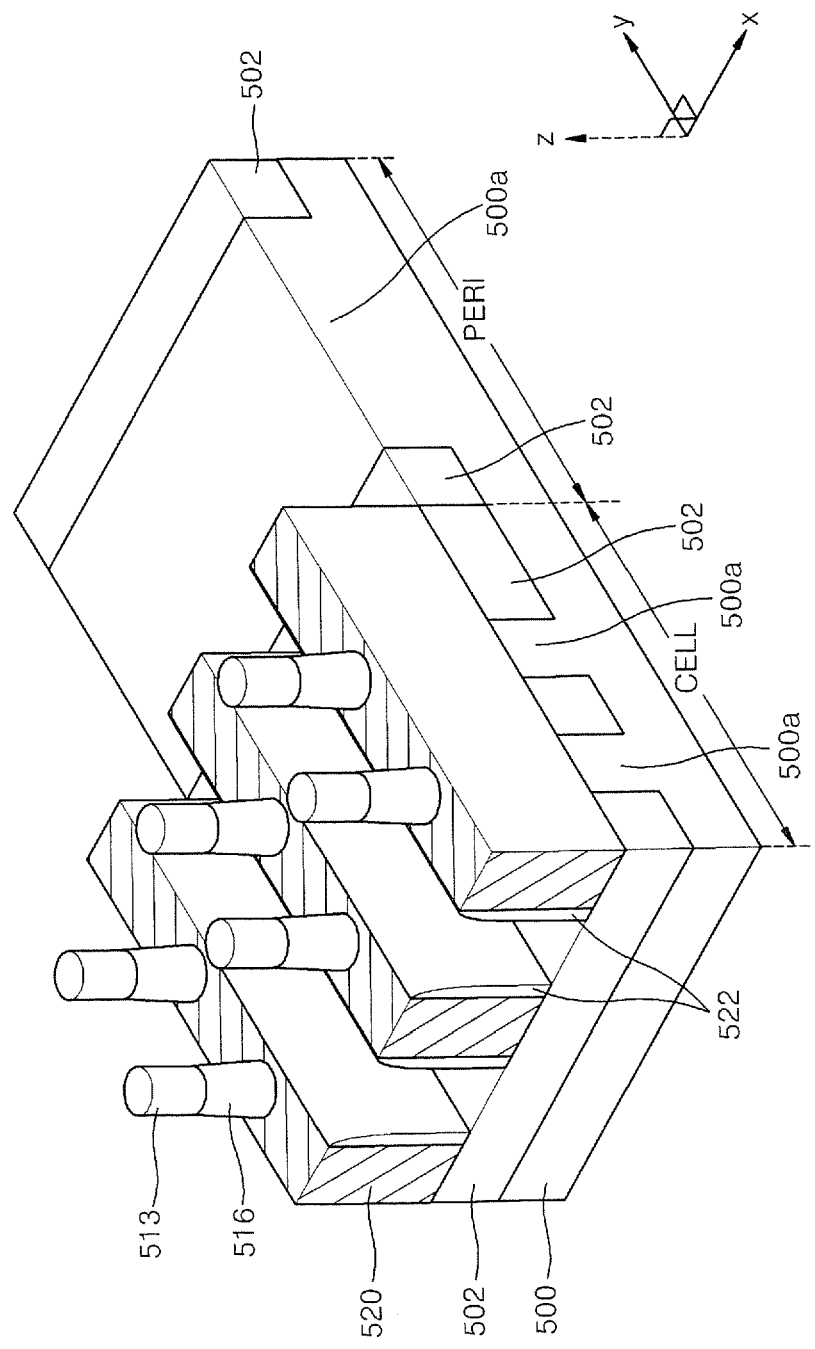

Referring to FIG. 18, the sacrificial insulating layer patterns 510b in the cell array region CELL and the sacrificial insulating layer 510 in the peripheral circuit region PERT may be removed. As a result, sidewalls of the word lines 520 and the active regions 500*a* between the sidewalls of the word lines 520 may be exposed in the cell array region CELL. The active region 500*a* may be exposed in the peripheral circuit region PERT.

An insulating layer for spacers may be deposited on the sidewalls of the word line 520 and the structure having the exposed protective layer 513 and first insulating layer 514 covering the pillar 512 on the word line 520 and then an etchback may be performed to form first insulating spacers 522 on the sidewalls of the word line 520. At this time, portions of the insulating layer for spacers may be maintained on the first insulating layers 514 covering the pillars 512, and therefore, pillar spacer 516 may be left on the first insulating layers 514 even in the vicinity of the pillar 512. The pillar spacers 516 may reduce short circuits between the pillars 512 and conductive patterns formed adjacent to the pillars 512.

Figure 19:
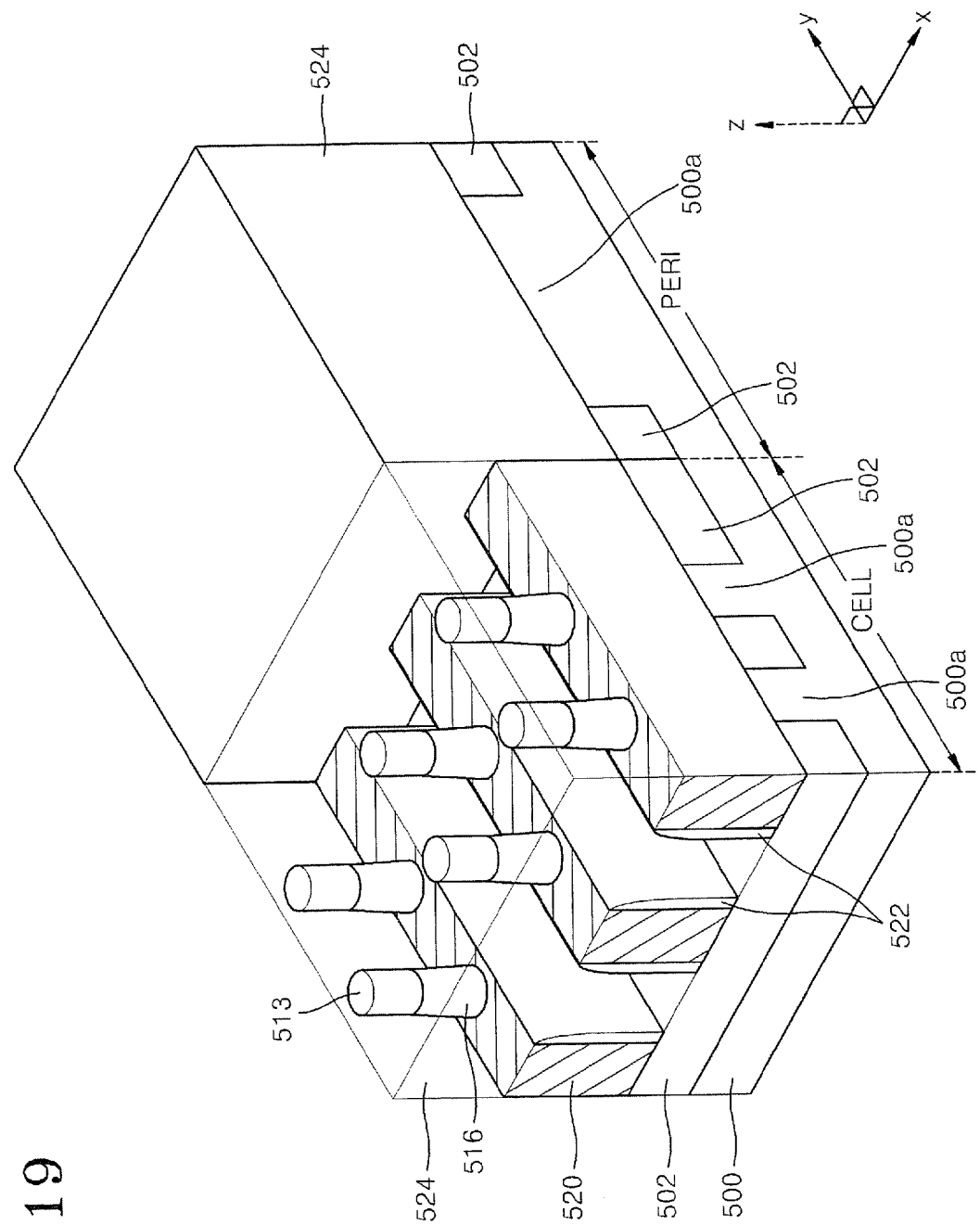

Referring to FIG. 19, a first interlayer dielectric layer 524 may be formed in cell array region CELL and peripheral circuit region PERI. In the cell array region CELL, the plurality of word lines 520 and the active regions 500*a* may be completely covered by the first interlayer dielectric layer 524. The first interlayer dielectric layer 524 may be formed such that top surfaces of the protective layers 513 may be exposed on a top surface of the first interlayer dielectric layer 524.

Figure 20:
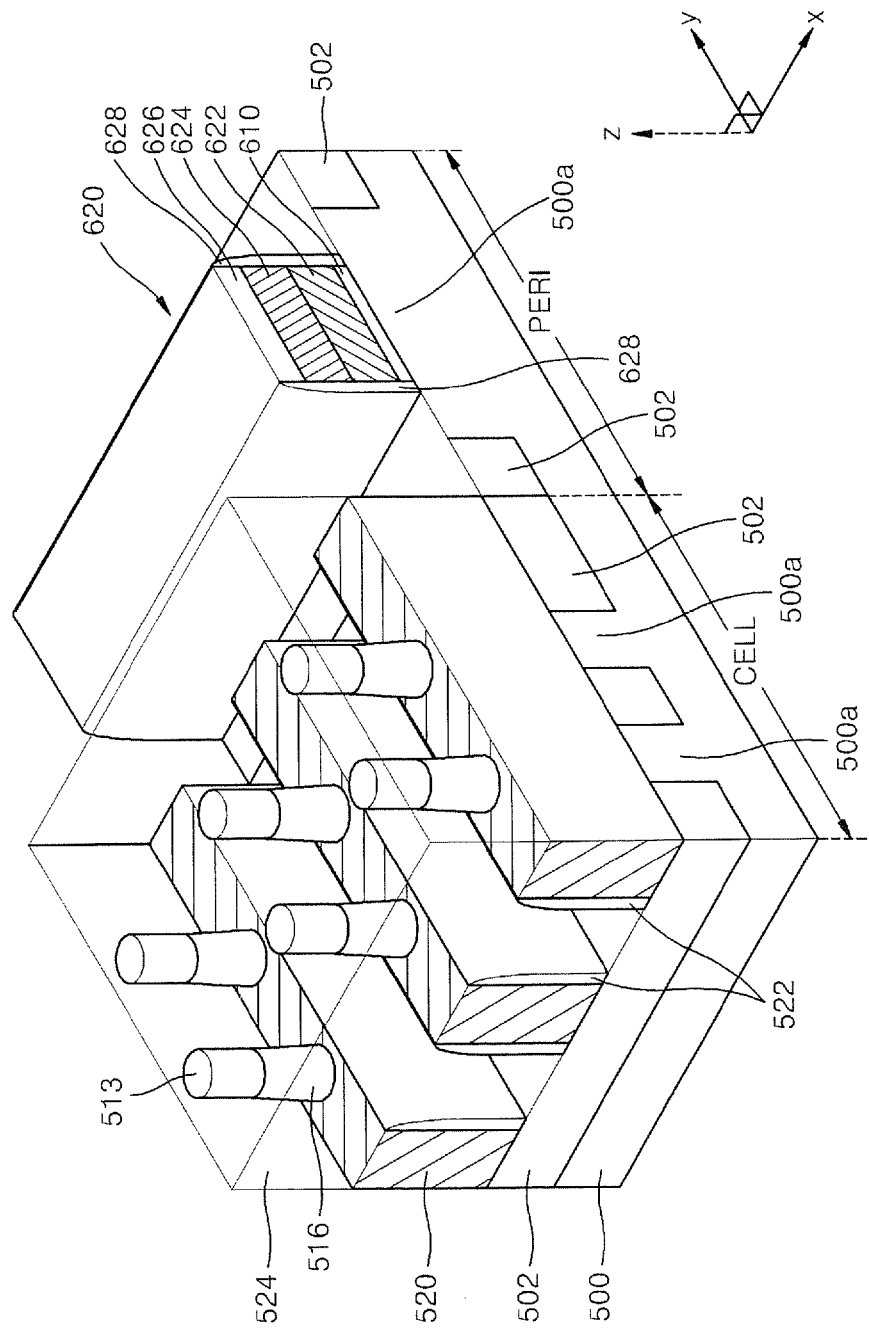

Referring to FIG. 20, when the cell array region CELL is covered by a mask pattern (not shown), the active region 500*a* may be exposed by removing the first interlayer dielectric layer 524 in the peripheral circuit region PERI. Thereafter, a gate electrode line 620 may be formed on the active region 500*a* in the peripheral circuit region PERI. In FIG. 20, the gate electrode line 620 may extend in the first direction (the x direction) that is an extension direction of the active region 500*a*. In this case, the gate electrode line 620 may have a structure extending in a direction perpendicular to the extension direction of the word lines 520 formed in the cell array region CELL. According to other embodiments of the present invention, the gate electrode line 620 may be formed to extend in the second direction (the y direction), and may have a structure extending in a direction parallel with the extension direction of the word lines 520 formed in the cell array region CELL. The gate electrode line 620 may include conductive layers 622 and 624 formed on a gate insulating layer 610, and the conductive layers 622 and 624 may be formed of a combination a doped poly-silicon layer 622 and a tungsten layer 624, for example. The conductive layers 622 and 624 may be protected by a silicon nitride capping layer 626 and silicon nitride gate spacers 628.

Figure 21:
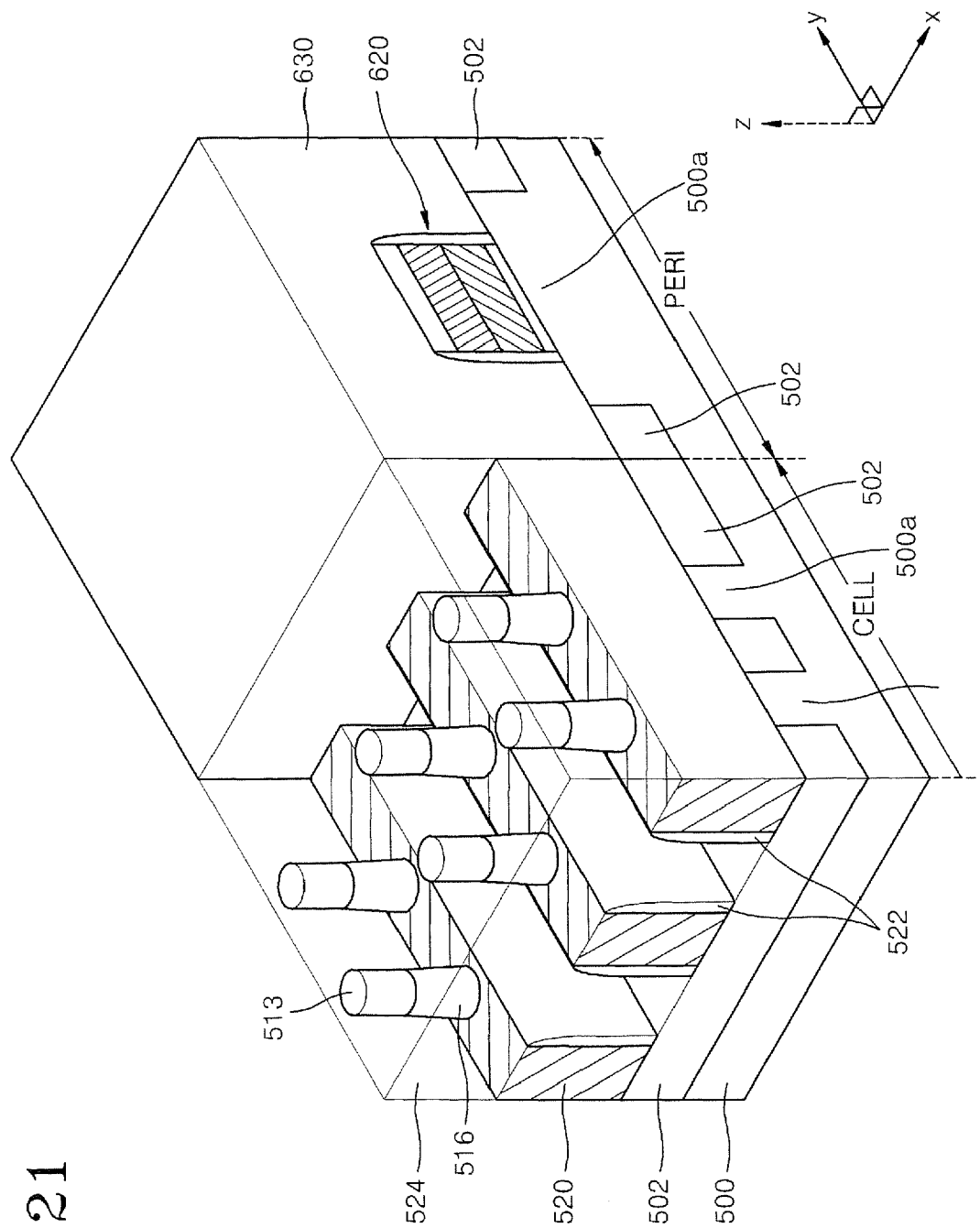

Referring to FIG. 21, a first interlayer dielectric layer 630 for a peripheral circuit may be formed to cover the gate electrode line 620 in the peripheral circuit region PERI. The first interlayer dielectric layer 630 for a peripheral circuit may be planarized using a CMP process to have a same height as that of the first interlayer dielectric layer 524 formed in the cell array region CELL.

Figure 22:
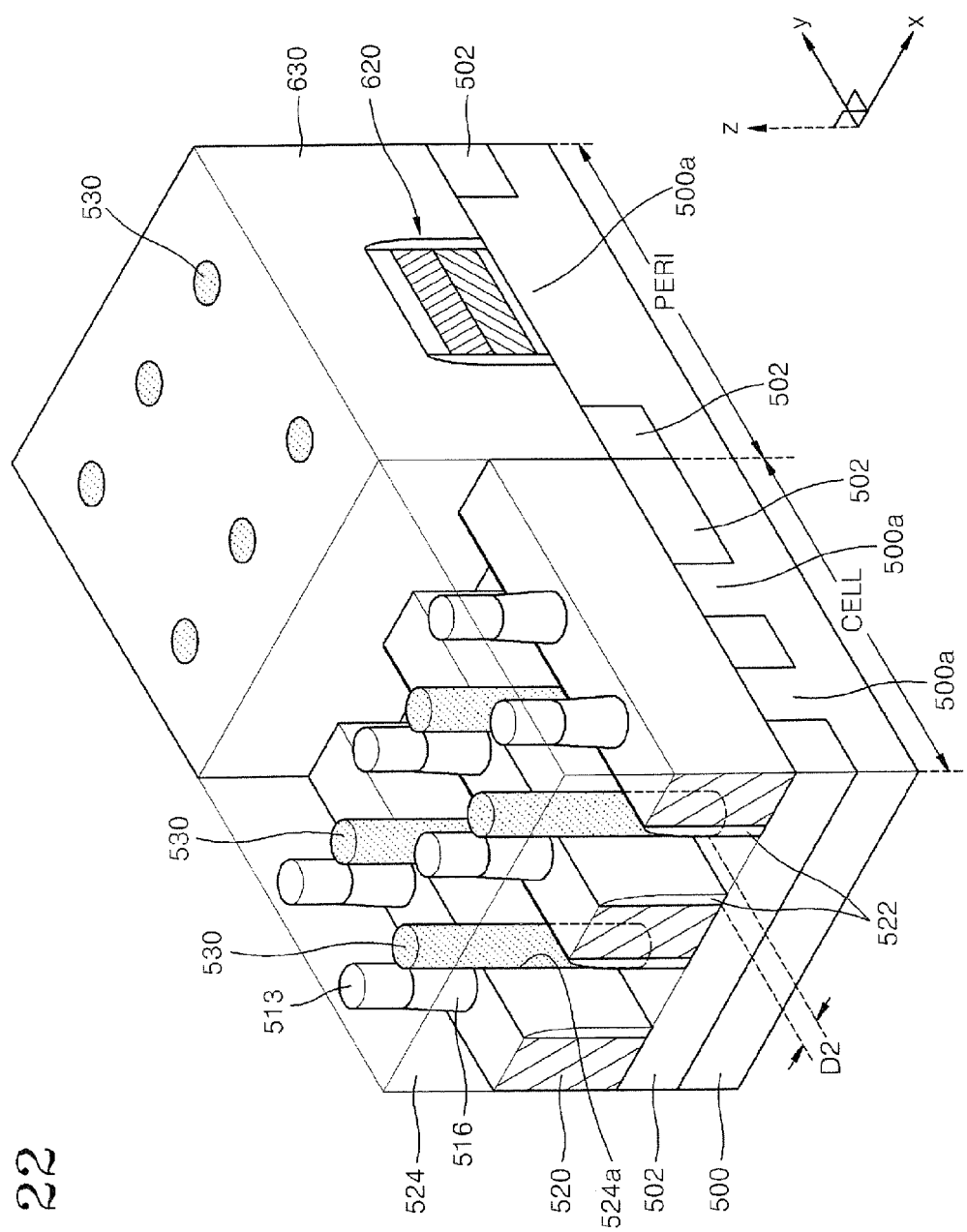

Referring to FIG. 22, portions of the first interlayer dielectric layer 524 and the first interlayer dielectric layer 630 for a peripheral circuit may be etched using a photolithography process in the cell array region CELL and the peripheral circuit region PERI, thereby forming a plurality of second holes 524*a* exposing a plurality of regions spaced apart from the word line 520 in the active region 500*a* at a predetermined distance, e.g., distance D2 in the cell array region CELL. When a method for manufacturing a semiconductor memory device according to embodiments of the present invention is applied to a method for forming a memory cell having a unit cell size of $5F^2$, the distance D2 between a word line 520 and a respective second hole 524*a* may be greater than when a method for manufacturing a semiconductor memory device according to embodiments of the present invention is applied to a method for forming a memory cell having a unit cell size of $4F^2$. In FIG. 22, the second holes 524*a* may be formed in a roughly circular shape. However, embodiments of the present invention are not limited thereto. For example, the second hole 524*a* may be formed in a rectangular or elliptical shape.

First impurity regions (not shown) (corresponding to the first impurity regions 128 of FIG. 1) may be formed by performing ion implantation with respect to regions exposed through the second holes 524*a* in the active regions 500*a*. The process of forming the first impurity regions may be the same as that described with reference to FIGS. 6A and 6B.

When the first impurity regions are exposed through the second holes 524*a*, a conductive material may be deposited on the semiconductor substrate 500 so that the second holes 524*a* are completely filled, and a CMP and/or an etchback may then be performed until top surfaces of the first interlayer dielectric layer 524 and the first interlayer dielectric layer 630 for a peripheral circuit are exposed, thereby forming first contact plugs 530 in the second holes 524*a*. The first contact plugs 530 may connect bit lines, which will be formed in a subsequent process, to the active regions 500*a*.

Figure 23:
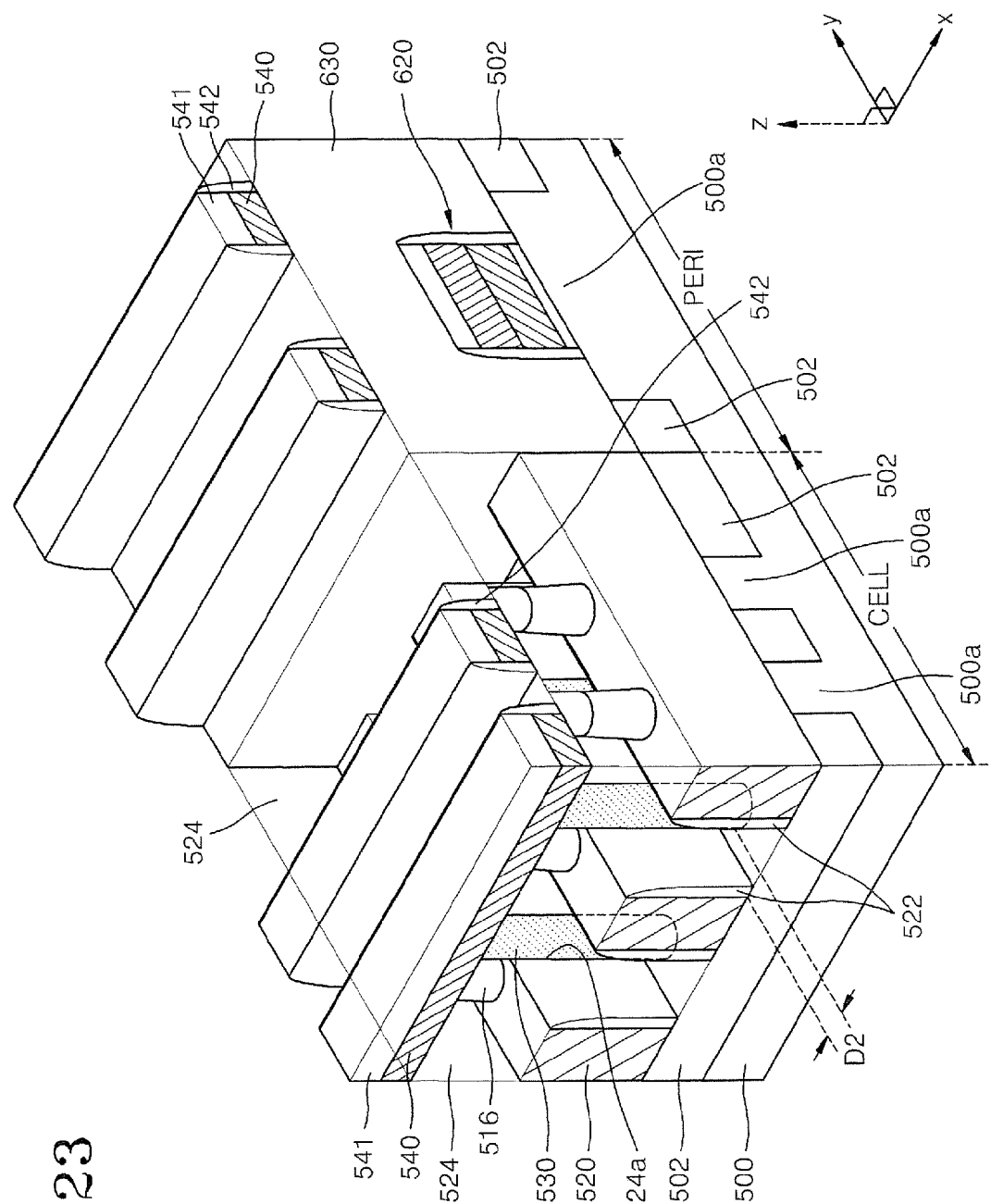

Referring to FIG. 23, a conductive layer used to form bit lines may be formed on top surfaces of the first contact plugs 530, the first interlayer dielectric layer 524 and the first interlayer dielectric layer 630 for a peripheral circuit and then patterned, thereby forming a plurality of bit lines 540. Each of the plurality of bit lines 540 may be formed into a structure in which a top surface and sidewalls of the bit line 540 are covered by a capping layer 541 and second insulating spacers 542, respectively.

In FIG. 23, the plurality of bit lines 540 may be formed in a plurality of parallel line patterns extending in the first direction (the x direction) on the first contact plugs 530. However, if the word lines 620 in the peripheral circuit region PERI extend in the second direction (the y direction), the plurality of bit lines 540 may be formed in a plurality of parallel line patterns extending in the second direction (the y direction) on the first contact plugs 530.

Each bit line 540 may be electrically connected to a first impurity region formed in a respective active region 500*a* through a respective first contact plug 530.

In the cell array region CELL, each of the plurality of bit lines 540 may be formed on a respective first contact plug 530 in a region between two adjacent active regions 500*a* among the plurality of active regions 500*a*. A material of bit lines 540 may be the same as that of the bit line 140 described with reference to FIGS. 7A and 7B.

Thereafter, the semiconductor memory device according to embodiments of the present invention may be completed by performing a series of processes described with reference to FIGS. 8A, 8B, 9A and 9B, for example. At this time, protective layers 513 remaining on top surfaces of pillars 512 may be removed.

FIGS. 24A through 24E are cross-sectional views illustrating sequential steps/operations used to manufacture a semiconductor memory device according to still other embodiments of the present invention.

Figure 24A:
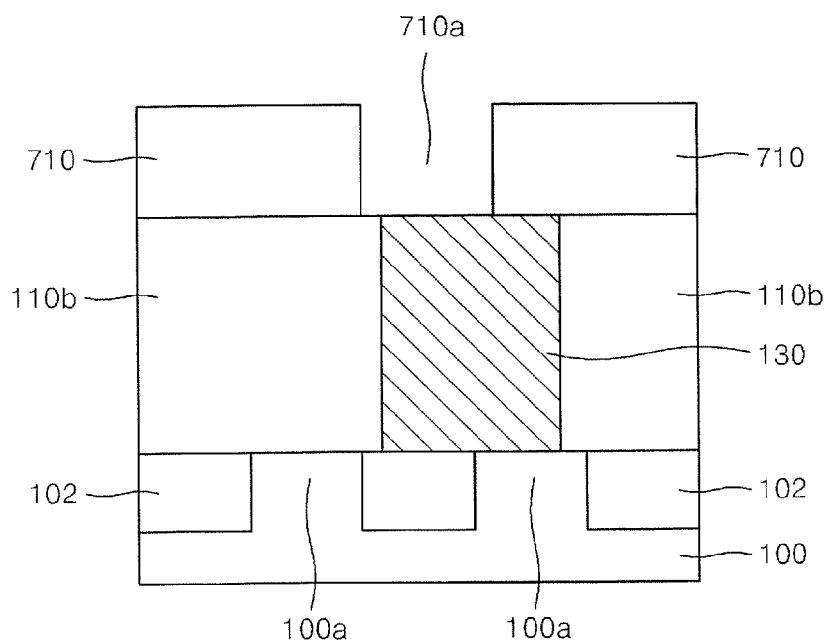
FIGS. 24A through 24E are cross-sectional views sequentially illustrating steps of manufacturing a semiconductor memory device according to still other embodiments of the present invention.
Figure 24B:
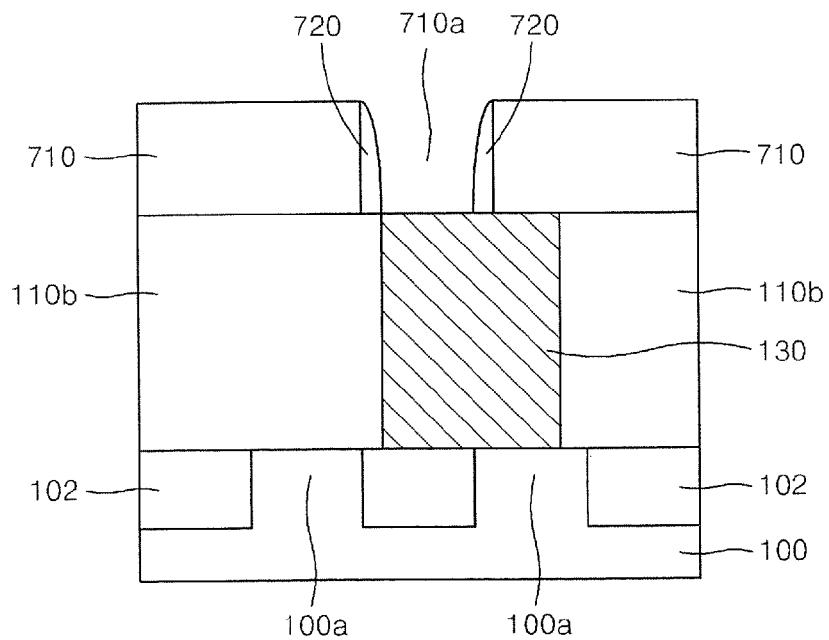
Figure 24C:
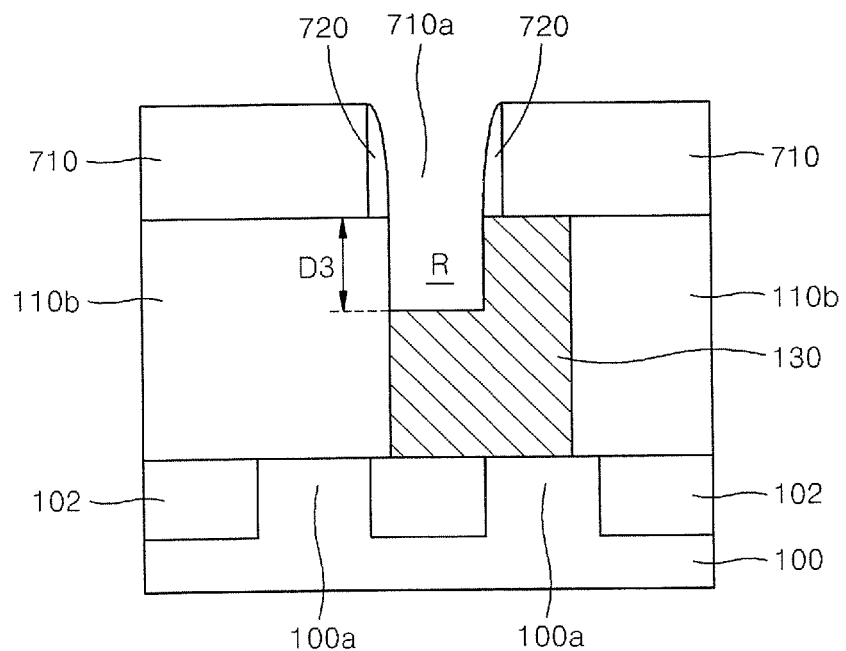

FIGS. 24A through 24E are views taken along line 24-24' of FIG. 1. In FIGS. 24A through 24C, reference numerals the same as those of FIGS. 2A to 9A and 2B to 9B designate corresponding elements for convenience of illustration and detailed descriptions of the elements will be omitted.

Referring to FIG. 24A, operations used to form the structure including first contact plugs 130 on semiconductor substrate 100 may be performed using the same operations as described with reference to FIGS. 2A to 6A and 2B to 6B. Thereafter, an insulating mold layer pattern 710 may be formed on first interlayer dielectric layer patterns 110b to partially expose top surfaces of the first contact plugs 130. A plurality of space lines 710a (trenches) may be formed to extend in the same direction as an extension direction of active regions 110a while exposing the top surfaces of the first contact plugs 130.

Referring to FIG. 24B, second insulating spacers 720 may be formed in spare lines 710a covering sidewalls of the insulating mold layer pattern 710 by forming an insulating layer covering top surfaces and sidewalls of the insulating mold layer pattern 710 and then performing an etch back of the insulating layer.

Referring to FIG. 24C, portions of first contact plugs 130 exposed between the second insulating spacers 720 through the space lines 710a may be etched to a predetermined depth D3, thereby forming recesses R having bottom surfaces lower than top surfaces of first contact plugs 130 in upper portions of first contact plugs 130.

Figure 24D:
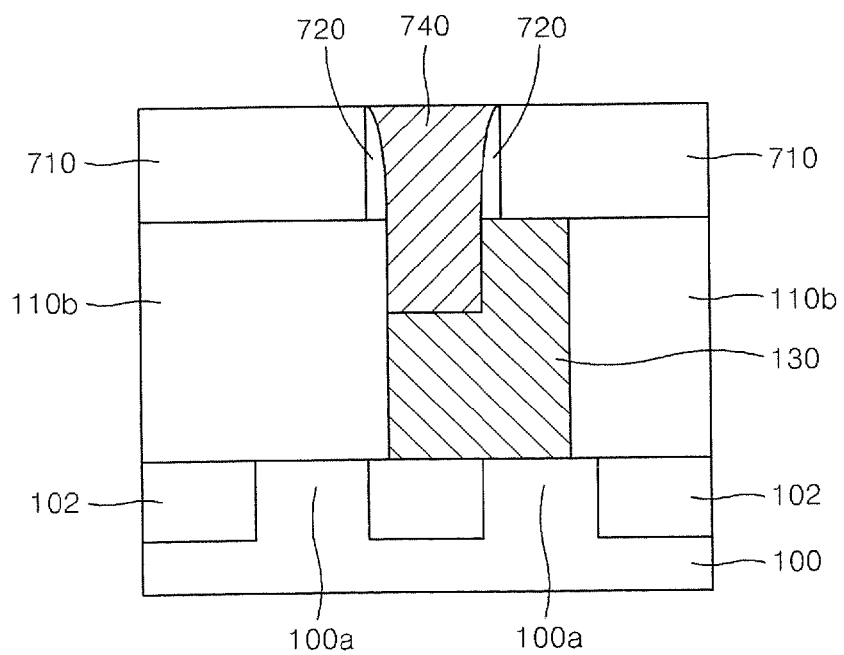

Referring to FIG. 24D, a conductive layer may be formed on the insulating mold layer pattern 710 to completely fill in the space line 710a and the recess R of each contact plug. The conductive layer may then be planarized until the top surface of the insulating mold layer pattern 710 is exposed, thereby forming a bit line 740 filled in the space line 710a and the recess R of each contact plug.

Figure 24E:
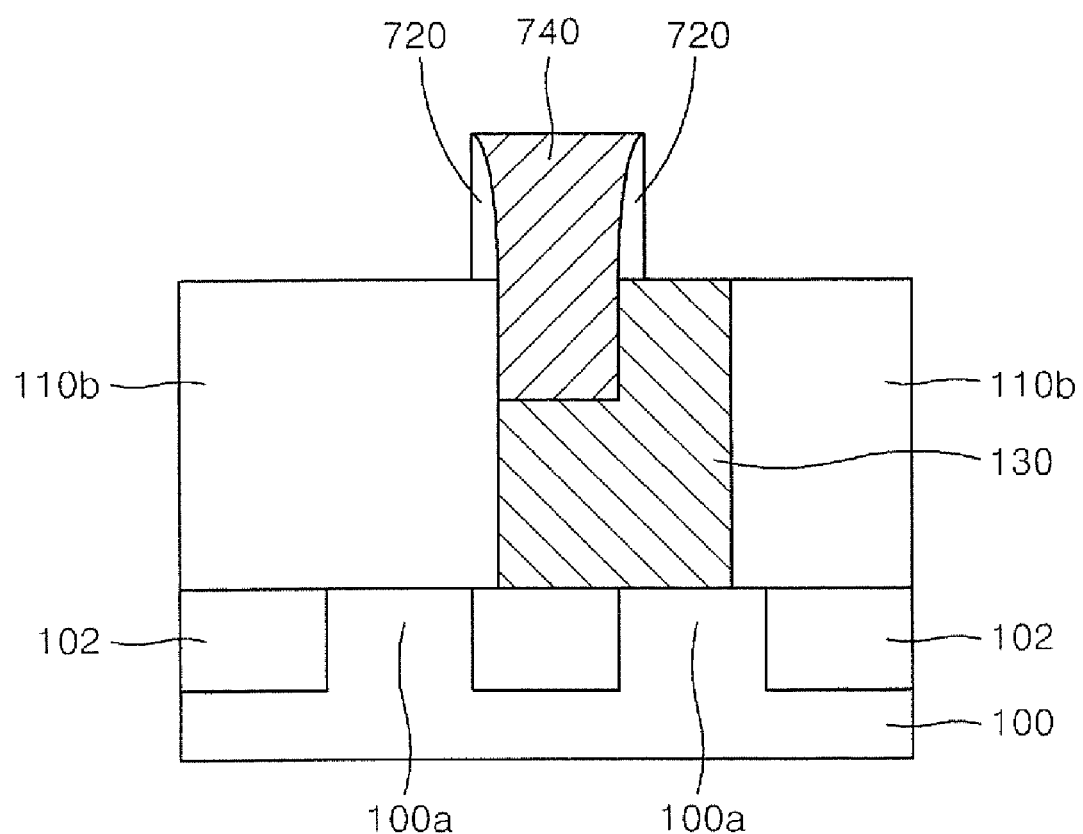

Referring to FIG. 24E, the insulating mold layer pattern 710 may be removed to expose the insulating spacers 720, top surfaces of first contact plugs 130 and top surfaces of first interlayer dielectric layer patterns 110b.

Thereafter, the semiconductor memory device according to embodiments of the present invention may be completed by performing the same series of processes as those described with reference to FIGS. 8A, 8B, 9A and 9B.

When manufacturing semiconductor memory devices according to embodiments of the present invention described with reference to FIGS. 24A through 24E, sidewalls of bit lines 740 as well as bottom surfaces of bit lines 740 may come in contact with first contact plugs 130 so that a broad (increased) contact area can be secured between bit lines 740 and respective first contact plugs 130.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. A semiconductor memory device comprising:
a semiconductor substrate including a plurality of active regions, wherein each of the active regions extends in a first direction parallel with respect to a surface of the semiconductor substrate;
a plurality of pillars extending from respective active regions in a direction perpendicular with respect to the surface of the semiconductor substrate with each of the pillars including a respective channel region on a sidewall thereof;
a plurality of impurity regions formed in respective active regions, wherein each of the impurity regions is disposed directly between a pair of the pillars and in a straight line with the pair of the pillars in the first direction;
a plurality of gate insulating layers surrounding respective sidewalls of the plurality of pillars;
a plurality of word lines extending in a second direction parallel with respect to the surface of the semiconductor substrate wherein the first and second directions are different and wherein respective ones of the word lines surround sidewalls of respective ones of the plurality of pillars so that the gate insulating layers are between the word lines and the pillars;
a plurality of contact plugs electrically connected to respective ones of the impurity regions and spaced apart from the word lines; and
a plurality of bit lines electrically connected to respective ones of the impurity regions through respective ones of the contact plugs wherein the plurality of bit lines extend in the first direction.

2. A semiconductor memory device according to claim 1 wherein each of the active regions comprises an island having a active region length in the first direction and an active region width in the second direction wherein the length is greater than the width, and
wherein each of the plurality of active regions is surrounded by an insulating device isolation layer.

3. A semiconductor memory device according to claim 2 wherein the plurality of active regions are arranged in an array of columns in the first direction and rows in the second direction wherein the first direction is perpendicular with respect to the second direction.

4. A semiconductor memory device according to claim 2 wherein the plurality of active regions are arranged in a plurality of parallel columns in the first direction and wherein active regions of adjacent columns are offset in the first direction.

5. A semiconductor memory device according to claim 2 wherein each of the contact plugs has a contact plug width in the first direction and a contact plug length in the second direction, wherein the first direction is perpendicular with respect to the second direction, wherein the active region width is at least as great as the contact plug width, and wherein the contact plug length is no more than two times greater than the active region width, wherein a first portion of each of the contact plugs extends on the respective active region directly between the respective pair of pillars on the respective active region, and wherein a second portion of the contact plugs extends directly on the insulating device isolation layer, and wherein portions of each of the contact plugs is directly between the respective bit line and the device isolation layer in a direction perpendicular with respect to a surface of the substrate.

6. A semiconductor memory device comprising:
a semiconductor substrate including a plurality of active regions, wherein each of the active regions extends in a first direction parallel with respect to a surface of the semiconductor substrate;
a plurality of pillars extending from respective active regions in a direction perpendicular with respect to the surface of the semiconductor substrate with each of the pillars including a respective channel region on a sidewall thereof;
a plurality of gate insulating layers surrounding respective sidewalls of the plurality of pillars;
a plurality of word lines extending in a second direction parallel with respect to the surface of the semiconductor substrate wherein the first and second directions are different and wherein respective ones of the word lines surround sidewalls of respective ones of the plurality of pillars so that the gate insulating layers are between the word lines and the pillars;

a plurality of contact plugs electrically connected to respective ones of the active regions and spaced apart from the word lines; and a plurality of bit lines electrically connected to respective ones of the active regions through respective ones of the contact plugs wherein the plurality of bit lines extend in the first direction;

wherein each of the plurality of contact plugs includes a recess in a surface thereof opposite the substrate, wherein each of the bit lines includes a lower surface adjacent the semiconductor substrate and sidewalls substantially perpendicular with respect to the surface of the substrate, and wherein portions of the lower surface and at least one of the sidewalls of one of the bit lines is in direct contact with one of the contact plugs at the recess thereof.

7. A semiconductor memory device according to claim 1 wherein each of the pillars includes an impurity region at an end portion thereof opposite the semiconductor substrate so that the channel region is between the impurity region and the semiconductor substrate.

8. A semiconductor memory device according to claim 7 further comprising:

a plurality of capacitors wherein each capacitor includes first and second electrodes and a capacitor dielectric layer therebetween, and wherein a first electrode of each of the plurality of capacitors is electrically coupled to an impurity region of a respective one of the pillars.

9. A semiconductor memory device according to claim 8 wherein a distance between the second electrodes of the capacitors and the semiconductor substrate is greater than a distance between the bit lines and the semiconductor substrate.

10. A semiconductor memory device comprising:

a semiconductor substrate including an active region extending in a first direction parallel with respect to a surface of the semiconductor substrate;

a first pillar extending from the active region in a direction perpendicular with respect to the surface of the semiconductor substrate wherein the first pillar includes a first channel region on a sidewall thereof;

a first gate insulating layer surrounding a sidewall of the first pillar;

a first word line extending in a second direction parallel with respect to the surface of the semiconductor substrate wherein the first and second directions are different and wherein the first word line surrounds the sidewall of the first pillar so that the first gate insulating layer is between the first word line and the first pillar;

a second pillar extending from the active region in the direction perpendicular with respect to the surface of the semiconductor substrate wherein the second pillar includes a second channel region on a sidewall thereof;

a second gate insulating layer surrounding the sidewall of the second pillar; and a second word line extending in the second direction wherein the second word line surrounds the sidewall of the second pillar so that the second gate insulating layer is between the second word line and the second pillar, a contact plug electrically connected to the impurity region and spaced apart from the first and second word lines; and a bit line electrically connected to the impurity region through the contact plug wherein the bit line extends in the first direction.

11. A semiconductor memory device according to claim 1 wherein each of the plurality of contact plugs includes a recess in a surface thereof opposite the substrate, wherein each of the bit lines includes a lower surface adjacent the semiconductor substrate and sidewalls substantially perpendicular with respect to the surface of the substrate, and wherein portions of the lower surface and at least one of the sidewalls of one of the bit lines is in direct contact with one of the contact plugs at the recess thereof.

12. A semiconductor memory device according to claim 11 wherein the at least one of the sidewalls of the one of the bit lines is in direct contact with a sidewall of the recess of the one of the contact plugs.

13. A semiconductor memory device according to claim 6 wherein the at least one of the sidewalls of the one of the bit lines is in direct contact with a sidewall of the recess of the one of the contact plugs.

14. A semiconductor memory device according to claim 2 wherein the plurality of active regions are arranged in an array of columns in the first direction and rows in the second direction wherein the first direction is perpendicular with respect to the second direction.

15. A semiconductor memory device according to claim 2 wherein the plurality of active regions are arranged in a plurality of parallel columns in the first direction and wherein active regions of adjacent columns are offset in the first direction.

16. A semiconductor memory device according to claim 10 wherein the contact plug includes a recess in a surface thereof opposite the substrate, wherein the bit line includes a lower surface adjacent the semiconductor substrate and sidewalls substantially perpendicular with respect to the surface of the substrate, and wherein portions of the lower surface and at least one of the sidewalls of the bit line is in direct contact with one of the contact plugs at the recess thereof.

17. A semiconductor memory device according to claim 16 wherein the at least one of the sidewalls of the bit line is in direct contact with a sidewall of the recess of the contact plug.

18. A semiconductor memory device according to claim 1 wherein at least two pairs of the pillars among the plurality of pillars extend from each of the active regions.

* * * * *